(12) United States Patent
Ikeda et al.

(10) Patent No.: US 6,876,134 B2
(45) Date of Patent: Apr. 5, 2005

(54) PIEZOELECTRIC/ELECTROSTRICTIVE DEVICE AND METHOD OF PRODUCING SAME

(75) Inventors: Koji Ikeda, Hisai (JP); Kazuyoshi Shibata, Mizunami (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/160,722

(22) Filed: Jun. 3, 2002

(65) Prior Publication Data

US 2002/0190612 A1 Dec. 19, 2002

(30) Foreign Application Priority Data

Jun. 18, 2001 (JP) ........................................ 2001-182898

(51) Int. Cl.[7] .............................................. H01L 41/08
(52) U.S. Cl. ...................................................... 310/330
(58) Field of Search .......................... 310/348, 30–332; H01L 41/08, 41/053

(56) References Cited

U.S. PATENT DOCUMENTS

| | | | | |
|---|---|---|---|---|
| 4,612,440 A | * | 9/1986 | Brunnee et al. | ............. 310/331 |
| 4,700,177 A | * | 10/1987 | Nakashima et al. | ...... 340/388.3 |
| 6,531,805 B2 | * | 3/2003 | Ikeda et al. | .................. 310/331 |
| 6,534,898 B1 | * | 3/2003 | Takeuchi et al. | ............ 310/328 |
| 6,534,899 B1 | * | 3/2003 | Takeuchi et al. | ....... 310/323.17 |

FOREIGN PATENT DOCUMENTS

EP      1 017 116 A2      7/2000

* cited by examiner

Primary Examiner—Darren Schuberg
Assistant Examiner—Karen Beth Addison
(74) Attorney, Agent, or Firm—Burr & Brown

(57) ABSTRACT

A piezoelectric/electrostrictive device includes a base 11 having a pair of movable parts 11a, 11b opposing each other and a connecting part 11c that connects movable parts 11a, 11b with each other at one end thereof as well as piezoelectric/electrostrictive elements 12a, 12b disposed on the side surfaces of movable parts 11a, 11b of base 11. The piezoelectric/electrostrictive device is constructed in a simple structure with fewer components. Base 11 is integrally formed in an open-box shape or in a horseshoe shape by bending one sheet of band-shaped flat plate. Movable parts 11a, 11b extend for a predetermined length from respective ends of connecting part 11c to the other ends. The other ends of movable parts 11a, 11b constitute a mounting site for mounting a component to be controlled or a component to be tested.

12 Claims, 17 Drawing Sheets

PIEZOELECTRIC/ELECTROSTRICTIVE DEVICE AND METHOD OF PRODUCING SAME

BACKGROUND OF THE INVENTION

1. Field of the Invention

The present invention relates to a piezoelectric/electrostrictive device, a base constituting the piezoelectric/electrostrictive device, and a method of producing the piezoelectric/electrostrictive device.

2. Description of the Background Art

As one form of piezoelectric/electrostrictive device, there is known a piezoelectric/electrostrictive device of a form that includes a base having a pair of movable parts that are arranged in parallel with each other to oppose each other and a connecting part that connects the two movable parts with each other at one end thereof as well as a piezoelectric/electrostrictive element disposed on an outer side surface of at least one of the two movable parts of the base, as disclosed in the specification of European Patent EP1017116A2.

The piezoelectric/electrostrictive device of such a form has a function of operating the movable parts caused by the displacement operation of the piezoelectric/electrostrictive element or a sensing function of sensing the displacement of the movable parts input from the side that is sensed, with the use of the piezoelectric/electrostrictive element. By effectively using these functions, the piezoelectric/electrostrictive device is used in a wide range of fields such as described below.

Namely, the piezoelectric/electrostrictive devices of such a form are used as active elements such as various transducers, various actuators, frequency region functional components (filters), transformers, vibrators and resonators for communication or mechanical power, oscillators, and discriminators, various sensor elements such as supersonic wave sensors, acceleration sensors, angular velocity sensors, impact sensors, and mass sensors, and various actuators that are put to use for displacement, positioning adjustment, and angle adjustment mechanism for various precision components of optical instruments and precision apparatus.

Meanwhile, the piezoelectric/electrostrictive device of such a form is generally composed of a base and at least one piezoelectric/electrostrictive element, and these are bonded to each other via an adhesive. Further, the base is composed of construction members that constitute a pair of movable parts and another construction member that connects these two construction members, and these construction members are bonded to each other via an adhesive.

Thus, the piezoelectric/electrostrictive device having such a form has a large number of construction members, so that the device is produced at a high cost and through a troublesome assembling work. Moreover, since the construction members are bonded to each other via an adhesive, there arises a dispersion of adhesion between the construction members, giving rise to a fear that the device characteristics may be adversely affected.

Further, the piezoelectric/electrostrictive device having such a form is produced by adopting means for cutting a device master suitably into a large number of devices. Therefore, the piezoelectric/electrostrictive devices formed by cutting are contaminated with dusts generated at the process of cutting, cutting fluid, and organic components such as an adhesive or wax used for holding the device master at the process of cutting, so that it is not easy to clean the piezoelectric/electrostrictive device.

Further, in the case where the base is constructed with a ceramic, i.e. a sintered body formed from plural sheets of ceramic green sheet laminates, one must adopt a hard ceramic material such as zirconia, since the ceramics are liable to be split. Even if a hard ceramic material is adopted, one must choose a suitable cutting condition so as not to generate loss of the material or cracks. Furthermore, since the base is made of a hard ceramic material, the machining process is difficult and, in order to increase process capacity, one must give a careful consideration such as use of a large number of machining apparatus having different functions.

Here, the base can be constructed with a metal material; however, the metal material gives rise to an oxidized end surface by friction heat during the cutting process and burrs remain on the processed end surface, so that one must add another step of removing these. Further, the piezoelectric/electrostrictive device can be tested only after the device master is cut.

Further, the device cut out from the device master is preferably cleaned by adopting supersonic wave cleaning so that the contamination can be easily removed. However, if a strong supersonic wave is used to obtain a high cleaning effect in supersonic wave cleaning, the device may be damaged, and the piezoelectric/electrostrictive element may be broken or exfoliated from the base. For this reason, if the supersonic wave cleaning is adopted, one must select a weak supersonic wave that does not give damages to the device. However, if such a cleaning condition is adopted, a long period of time is needed in removing the contamination that has adhered at the process of cutting.

Dust generation from the piezoelectric/electrostrictive device may cause the following problems. For example, in the case where the piezoelectric/electrostrictive device is used as an actuator of a magnetic head in a hard disk drive, if dust is generated in the drive, the dust may cause crash of the floating slider onto the medium, thereby raising a fear of data destruction. Also, for the piezoelectric/electrostrictive device itself, the dust may adhere to the electrode of the piezoelectric/electrostrictive device, thereby giving rise to a fear of short circuit. For this reason, a high level of cleaning is required not only in the hard disk drive but also in the device itself.

Therefore, an object of the present invention is to solve the aforementioned problems of the prior art by allowing the base constituting the piezoelectric/electrostrictive device of that form to have an integral structure using one sheet of flat plate as an original plate.

SUMMARY OF THE INVENTION

The present invention relates to a piezoelectric/electrostrictive device and is directed to a piezoelectric/electrostrictive device of a form that includes a base having a pair of movable parts that are arranged in parallel with each other to oppose each other and a connecting part that connects the two movable parts with each other at one end thereof as well as a piezoelectric/electrostrictive element disposed on an outer side surface of at least one of the two movable parts of the base.

Here, the piezoelectric/electrostrictive device according to the present invention is constructed in such a manner that the base constituting the piezoelectric/electrostrictive device of the above-described form is integrally constructed with one sheet of band-shaped flat plate, and the movable parts extend for a predetermined length from respective ends of the aforesaid connecting part to other ends.

In the aforesaid piezoelectric/electrostrictive device, the base can be constructed with a flat plate made of metal.

Further, the aforesaid piezoelectric/electrostrictive device can be used in a mode in which a component to be controlled or tested is sandwiched between inner surfaces of the other ends of the two movable parts constituting the base.

The piezoelectric/electrostrictive device according to the present invention can be constructed in such a manner that the piezoelectric/electrostrictive element is shorter than the movable parts and is positioned either at the other end of the movable parts or at the one end of the movable parts.

The piezoelectric/electrostrictive device according to the present invention can be constructed in such a manner that the base has a generally open-box shape that is open to the other end of the two movable parts. In this case, the piezoelectric/electrostrictive device can be constructed in such a manner that the base includes a flat plate part disposed on an inner surface or on an outer surface of the connecting part. Further, the piezoelectric/electrostrictive device according to the present invention can be constructed in such a manner that the base has a generally horseshoe shape that is open to the other end of the two movable parts, or in such a manner that the connecting sites between the ends of the connecting part and the movable parts are formed as recesses having a circular arc shape. Furthermore, the piezoelectric/electrostrictive device according to the present invention can be constructed in such a manner that the movable parts of the base include thinned portions located in a middle of a length thereof.

The present invention also provides a method of producing a base constituting a piezoelectric/electrostrictive device according to the present invention, including the steps of preparing a flexible and bendable flat plate as a material for forming the base; cutting the flat plate into flat plates each having a shape that delineates a planar development of the base thereby to form original plates having a narrow strip shape; and bending each of the original plates at predetermined sites to form the base integrally having the two movable parts and the connecting part.

Further, the present invention provides a method of producing a piezoelectric/electrostrictive device according to the present invention, including the steps of preparing a flexible and bendable flat plate as a material for forming the base; cutting the flat plate into flat plates each having a shape that delineates a planar development of the base thereby to form original plates having a narrow strip shape; bending each of the original plates at predetermined sites so as to form the base integrally having the two movable parts and the connecting part; and bonding a piezoelectric/electrostrictive element onto an outer side surface of at least one of the two movable parts constituting the base thereby to form the piezoelectric/electrostrictive device.

Furthermore, another method of producing a piezoelectric/electrostrictive device according to the present invention includes the steps of preparing a flexible and bendable flat plate as a material for forming the base, the flat plate having a piezoelectric/electrostrictive element bonded thereto at a predetermined site in advance; cutting the flat plate integrally with the piezoelectric/electrostrictive element into flat plates each having a shape that delineates a planar development of the base thereby to form original plates having a narrow strip shape; and bending each of the original plates at predetermined sites to form the base integrally having the two movable parts and the connecting part and to form the piezoelectric/electrostrictive device having the piezoelectric/electrostrictive element bonded onto an outer side surface of at least one of the two movable parts.

The piezoelectric/electrostrictive device according to the present invention has an integral structure in which the base constituting the piezoelectric/electrostrictive device is constructed with one sheet of band-shaped flat plate, so that the base is in principle constructed with one piece of construction member. Therefore, the construction members of each device are two kinds, namely, the base and the piezoelectric/electrostrictive element, so that the number of construction members of the piezoelectric/electrostrictive device can be greatly reduced, and man hour for assembling the construction members can be greatly reduced, thereby leading to large reduction of costs.

Further, in the piezoelectric/electrostrictive device according to the present invention, since the number of construction members is extremely small and the number of bonding sites between the construction members is extremely small, there is little or no dispersion in the adhesion between the construction members, whereby the piezoelectric/electrostrictive device has device characteristics in which the set precision is high.

Such an effective piezoelectric/electrostrictive device can be produced with ease and at a low cost by each of the above-described production methods according to the present invention. In particular, the base constituting the piezoelectric/electrostrictive device according to the present invention can be produced with ease and at a low cost by adopting a production method including the steps of preparing a flexible and bendable flat plate as a material for forming the base; cutting the flat plate into flat plates each having a shape that delineates a planar development of the base thereby to form original plates having a narrow strip shape; and bending each of the original plates at predetermined sites to form the base integrally having the two movable parts and the connecting part.

BRIEF DESCRIPTION OF THE DRAWINGS

These and other objects, features, aspects, and advantages of the present invention will become more apparent from the following detailed description of the present invention when taken in conjunction with the accompanying drawings, in which.

DESCRIPTION OF THE PREFERRED EMBODIMENTS

The present invention is a piezoelectric/electrostrictive device that includes a base having a pair of movable parts that are arranged in parallel with each other to oppose each other and a connecting part that connects the two movable parts with each other at one end thereof as well as a piezoelectric/electrostrictive element disposed on an outer side surface of at least one of the two movable parts in the base, wherein the base is integrally formed with one sheet of band-shaped flat plate that is bent in an open-box shape or in a horseshoe shape. FIGS. 1A to 1H are model views respectively illustrating numerous embodiments (first embodiment to eighth embodiment) of the piezoelectric/electrostrictive devices according to the present invention.

Figure 1D:
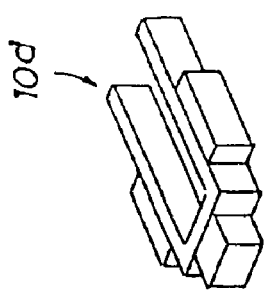
FIGS. 1A to 1H are perspective model views respectively illustrating eight types of embodiments of the piezoelectric/electrostrictive devices according to the present invention.
Figure 1C:
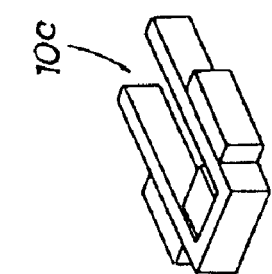

The first to sixth embodiments shown in FIGS. 1A to 1F are piezoelectric/electrostrictive devices in which the base has an open-box shape. The seventh embodiment shown in FIG. 1G is a piezoelectric/electrostrictive device in which the base has a horseshoe shape. The eighth embodiment shown in FIG. 1H is a piezoelectric/electrostrictive device in which the base has an open-box shape, and the connecting sites between the ends of the connecting part and the movable parts are formed as recesses having a circular arc shape.

The first piezoelectric/electrostrictive device 10a constituting the first embodiment and the second piezoelectric/electrostrictive device 10b constituting the second embodiment have a basic construction of the piezoelectric/electrostrictive device according to the present invention. The first piezoelectric/electrostrictive device 10a is formed by the method shown in FIGS. 2 and 3, and the second piezoelectric/electrostrictive device 10b is formed by the method shown in FIG. 4.

Figure 3A:
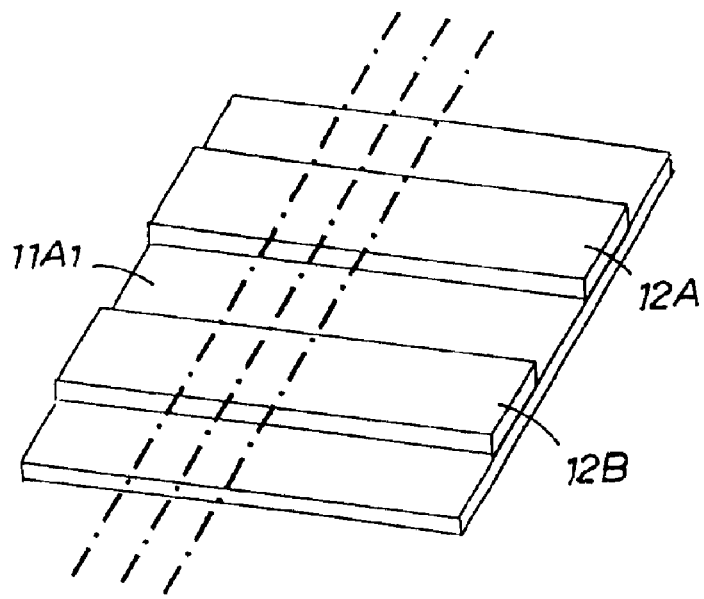
FIG. 3A is a perspective view illustrating a method of preparing the original plate of the base that constitutes the first piezoelectric/electrostrictive device.
Figure 3B:
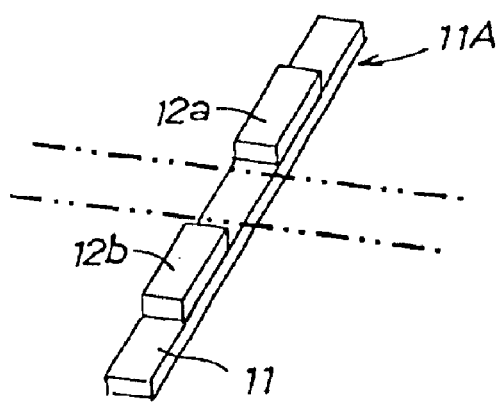
FIG. 3B is a perspective view of the original plate.
Figure 3C:
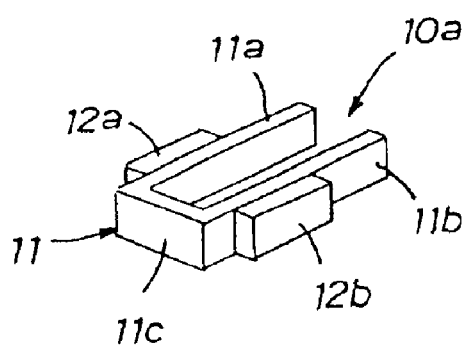
FIG. 3C is a perspective view of the piezoelectric/electrostrictive device composed of the base that is formed from the original plate.

Referring to FIG. 3C, the first piezoelectric/electrostrictive device 10a is made of a base 11 and a pair of piezoelectric/electrostrictive elements 12a, 12b. Base 11 is formed by bending a long and narrow original plate into an open-box shape, and is constructed with a pair of right and left movable parts 11a, 11b and a connecting part 11c that connects the two movable parts 11a, 11b with each other at one end thereof. In the base 11, the piezoelectric/electrostrictive elements 12a, 12b are bonded respectively to outer side surfaces of the movable parts 11a, 11b via an adhesive made of epoxy resin or the like.

Each of Piezoelectric/electrostrictive elements 12a, 12b is a laminate body made of piezoelectric/electrostrictive layers and electrode films, and is formed to have the same shape as movable parts 11a, 11b and to be shorter by a predetermined length than movable parts 11a, 11b. Piezoelectric/electrostrictive elements 12a, 12b are bonded at one end of movable parts 11a, 11b in proximity to connecting part 11c and extend for a predetermined length towards the other end of movable parts 11a, 11b.

The first piezoelectric/electrostrictive device 10a is used in such a manner that an actuator (not illustrated) is disposed on connecting part 11c of base 11, and a magnetic head (slider) for a hard disk, which is a component to be controlled (not illustrated), for example, is disposed between the two movable parts 11a, 11b.

Figure 2A:
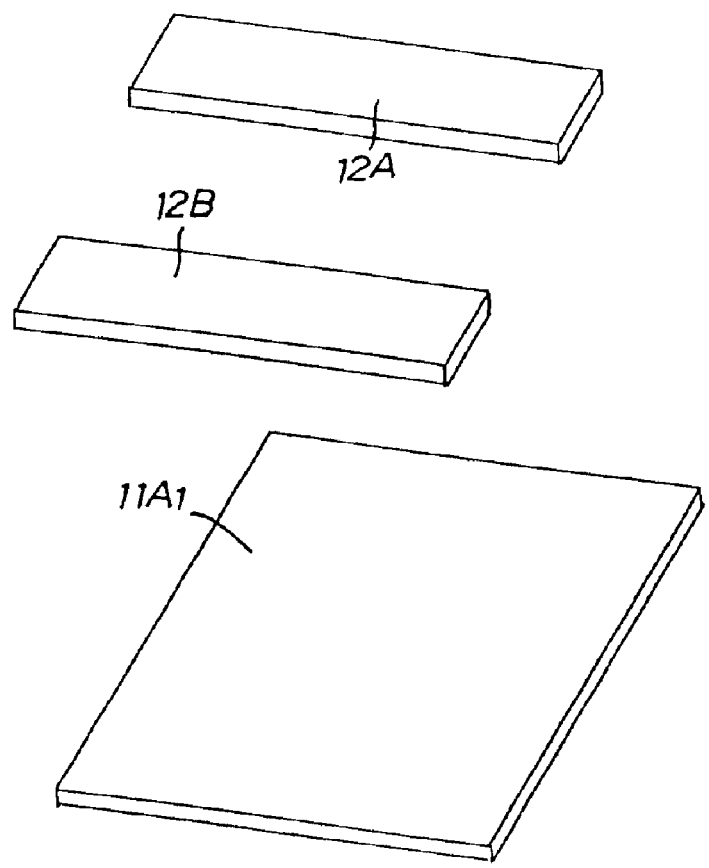
FIG. 2A is a perspective view illustrating a method of preparing a flat plate for forming an original plate that constitutes a base of the first piezoelectric/electrostrictive device which is the first embodiment of the present invention.
Figure 2B:
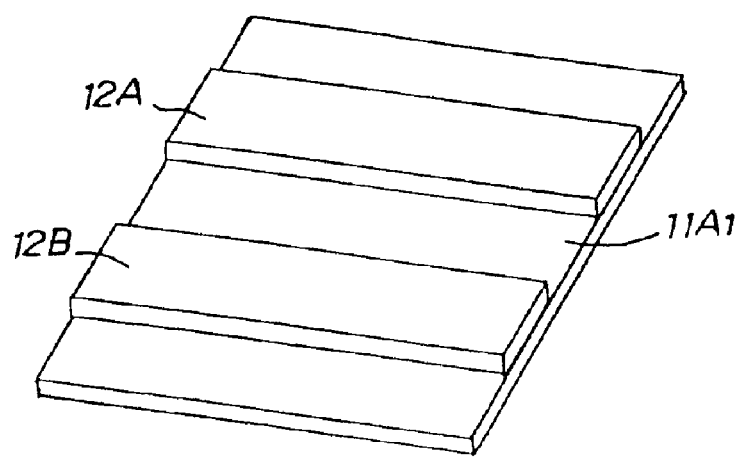
FIG. 2B is a perspective view of the flat plate.

Now, as the original plate for constructing the base 11 constituting the first piezoelectric/electrostrictive device 10a, an original plate 11A illustrated in FIG. 3B is adopted, and the original plate 11A is formed by the method shown in FIGS. 2A, 2B, and 3A. The original plate 11A illustrated in FIG. 3B is formed into the first piezoelectric/electrostrictive device 10a illustrated in FIG. 3C by bending the original plate 11A along two-dot chain lines shown in FIG. 3B.

The original plate 11A is basically made of a flat plate 11A1 shown in FIGS. 2A and 2B; further, two sheets of long piezoelectric/electrostrictive element master plates 12A, 12B, which will later become piezoelectric/electrostrictive elements 12a, 12b, are bonded thereto. Flat plate 11A1 having two piezoelectric/electrostrictive element master plates 12A, 12B bonded thereto is cut at numerous sites along the one-dot chain lines shown in FIG. 3A and lines parallel thereto, whereby numerous original plates 11A shown in FIG. 3B are formed. Original plate 11A is bent along the two-dot chain lines shown in FIG. 3B to form the first piezoelectric/electrostrictive device 10a shown in FIG. 3C.

Flat plate 11A1 is preferably a flat plate that is flexible and made of a metal having Young's modulus of 100 GPa or higher. As an iron-series material satisfying these properties, one can mention austenite-series stainless steels such as SUS301, SUS304, AISI653, and SUH660, ferrite-series stainless steels such as SUS430 and SUS434, martensite-series stainless steels such as SUS410 and SUS630, semiaustenite-series stainless steels such as SUS6312 and AISI632, maraging stainless steel, and steel materials such as various spring steels. As a non-iron-series material, one can mention superelastic titanium alloys such as a titanium-nickel alloy, brass, cupronickel, aluminum, tungsten, molybdenum, beryllium copper, phosphorus bronze, nickel, a nickel iron alloy, titanium, and others.

Here, in constructing the base with a metal material, it is preferable to adopt a metal plate in which at least the sites corresponding to the movable parts of the base are cold-rolled.

Thus, the first piezoelectric/electrostrictive device 10a functions in the same manner as the conventional piezoelectric/electrostrictive devices of this form and, since base 11 has an integral structure having original plate 11A as a construction member, piezoelectric/electrostrictive device 10a produces the following functions and effects.

Namely, the first piezoelectric/electrostrictive device 10a is constructed with base 11 having an integral structure made of original plate 11A alone. Therefore, the construction members are two kinds, namely, base 11 and piezoelectric/electrostrictive elements (12a, 12b), so that the number of construction members of piezoelectric/electrostrictive device 10a can be greatly reduced, and man hour for assembling the construction members can be greatly reduced, thereby leading to large reduction of costs.

Further, in the first piezoelectric/electrostrictive device 10a, since the number of construction members is extremely small and the number of bonding sites between the construction members is extremely small, there is little or no dispersion in the adhesion between the construction members, whereby the piezoelectric/electrostrictive device has device characteristics in which the set precision is high.

Furthermore, the first piezoelectric/electrostrictive device 10a has a construction such that original plate 11A is formed by bonding piezoelectric/electrostrictive element master plates 12A, 12B in advance onto the material (flat plate 11A1) for forming original plate 11A, which is a construction member of base 11, and cutting flat plate 11A1 integrally with piezoelectric/electrostrictive element master plates 12A, 12B. Therefore, in assembling the piezoelectric/electrostrictive device, the work of bonding piezoelectric/electrostrictive elements 12a, 12b onto movable parts 11a, 11b, which are extremely narrow and fine sites, can be eliminated, so that the assembling work is easy, and the precision of bonding piezoelectric/electrostrictive elements 12a, 12b onto movable parts 11a, 11b can be further improved.

Figure 1B:
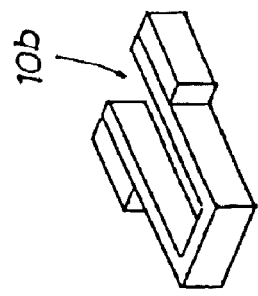
Figure 1A:
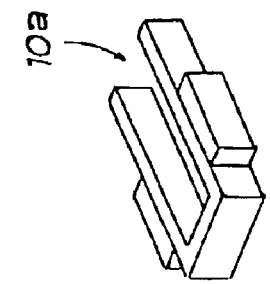
Figure 1H:
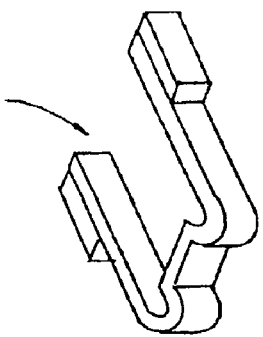
Figure 1G:
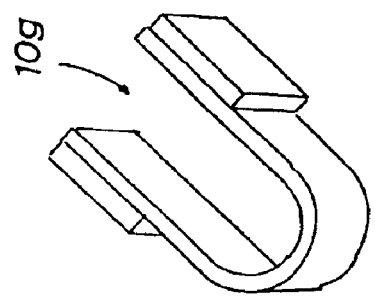

The second piezoelectric/electrostrictive device 10b shown in FIG. 1B and constituting the second embodiment of the present invention has another basic construction of the piezoelectric/electrostrictive device according to the present invention and is formed by the method shown in FIG. 4.

Figure 4A:
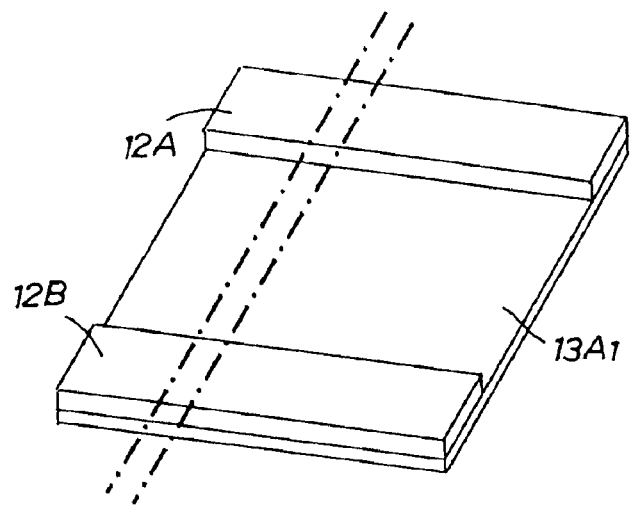
FIG. 4A is a perspective view illustrating a method of preparing the original plate of the base that constitutes the second piezoelectric/electrostrictive device.
Figure 4B:
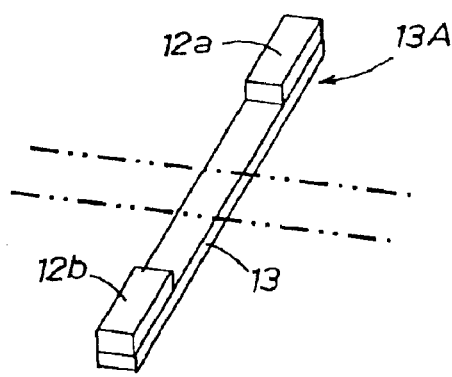
FIG. 4B is a perspective view of the original plate.
Figure 4C:
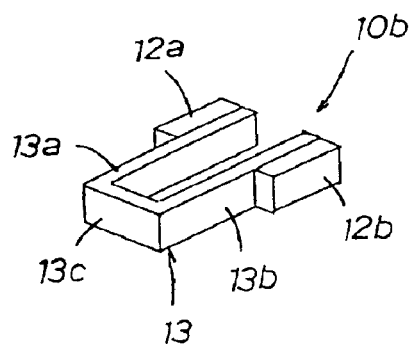
FIG. 4C is a perspective view of the piezoelectric/electrostrictive device composed of the base that is formed from the original plate.

Referring to FIG. 4C, the second piezoelectric/electrostrictive device 10b is made of a base 13 and a pair of piezoelectric/electrostrictive elements 12a, 12b. On this point, the second piezoelectric/electrostrictive device 10b is the same as the first piezoelectric/electrostrictive device 10a; however, the second piezoelectric/electrostrictive device 10b is different from the first piezoelectric/electrostrictive device 10a only in the position of disposing the piezoelectric/electrostrictive elements 12a, 12b. In the second piezoelectric/electrostrictive device 10b, piezoelectric/electrostrictive elements 12a, 12b are bonded to the other end of movable parts 13a, 13b, and extend for a predetermined length towards the one end of movable parts 11a, 11b, namely, towards the connecting part 13c side of base 13.

Now, as the original plate for constructing base 13 that constitutes the second piezoelectric/electrostrictive device 10b, an original plate 13A shown in FIG. 4B is adopted, and original plate 13A is formed by cutting a flat plate 13A1 shown in FIG. 4A along one-dot chain lines. Piezoelectric/electrostrictive element master plates 12A, 12B are bonded to end peripheries (as viewed in the forward-and-backward direction) of flat plate 13A1, and flat plate 13A1 is cut not only along the one-dot chain lines at two sites but also along numerous cutting lines (not illustrated) parallel to these one-dot chain lines, whereby numerous original plates 13A are cut out.

Original plate 13A is bent along the two-dot chain lines shown in FIG. 4B to be formed into the second piezoelectric/electrostrictive device 10b shown in FIG. 4C. The second piezoelectric/electrostrictive device 10b is different in construction from the first piezoelectric/electrostrictive device 10a in that the two piezoelectric/electrostrictive elements 12a, 12b are placed at the other end of the two movable parts 13a, 13b; however, the two have the same construction on the other points. Therefore, the second piezoelectric/electrostrictive device 10b has a function similar to that of the first piezoelectric/electrostrictive device 10a, and produces similar actions and effects.

The third and fourth piezoelectric/electrostrictive devices 10c, 10d shown in FIGS. 1C and 1D and constituting the third and fourth embodiments of the present invention are based on the first piezoelectric/electrostrictive device 10a in construction. The fifth and sixth piezoelectric/electrostrictive devices 10e, 10f shown in FIGS. 1E and 1F and constituting the fifth and sixth embodiments of the present invention are based on the second piezoelectric/electrostrictive device 10b in construction.

Figure 5A:
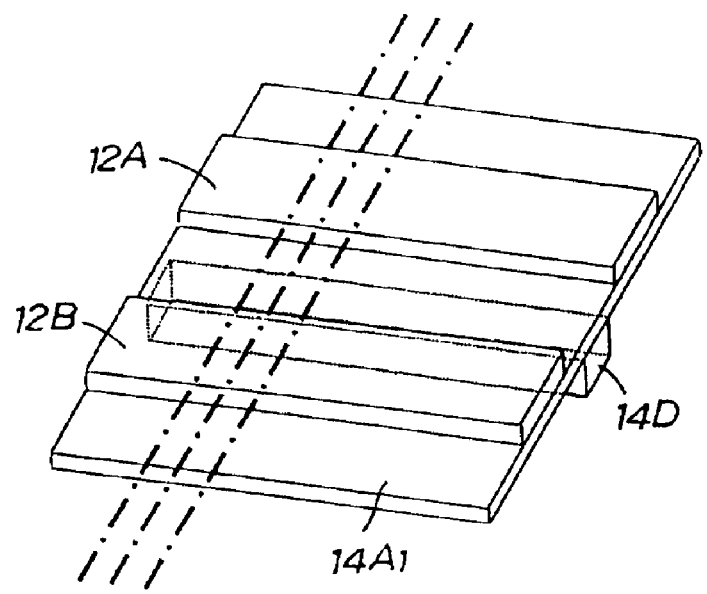
FIG. 5A is a perspective view illustrating a method of preparing the original plate of the base that constitutes the third piezoelectric/electrostrictive device.
Figure 5B:
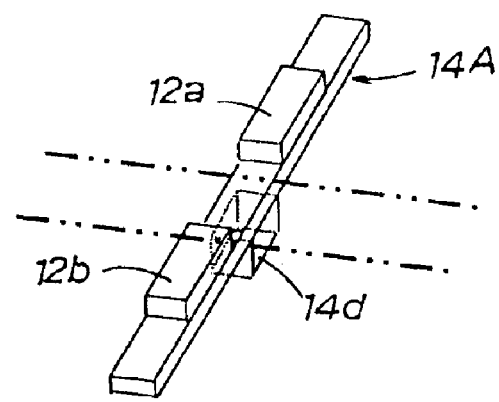
FIG. 5B is a perspective view of the original plate.
Figure 5C:
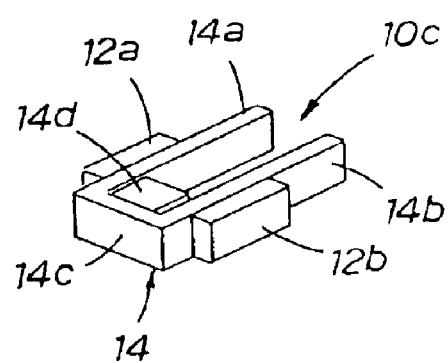
FIG. 5C is a perspective view of the piezoelectric/electrostrictive device composed of the base that is formed from the original plate.

Referring to FIG. 5C, the third piezoelectric/electrostrictive device 10c shown in FIG. 1C is made of a base 14 and a pair of piezoelectric/electrostrictive elements 12a, 12b. On this point, the third piezoelectric/electrostrictive device 10c is the same as the first piezoelectric/electrostrictive device 10a; however, the third piezoelectric/electrostrictive device 10c is different from the first piezoelectric/electrostrictive device 10a in that a flat plate part 14d is disposed on the connecting part 14c constituting the base 14. Flat plate part 14d is placed on the inner surface side of connecting part 14c between the two movable parts 14a, 14b. Flat plate part 14d functions to reinforce connecting part 14c, and also functions to enlarge the bonding area to an actuator or the like when connecting part 14c is used as a supporting part for the actuator or the like.

Now, as the original plate for constructing base 14 of the third piezoelectric/electrostrictive device 10c, an original plate 14A shown in FIG. 5B is adopted, and original plate 14A is formed by cutting a flat plate 14A1 shown in FIG. 5A along one-dot chain lines. Piezoelectric/electrostrictive element master plates 12A, 12B are bonded to two sites in the middle part (as viewed in the forward-and-backward direction) on the front surface of flat plate 14A1, and a flat-plate-shaped member 14D that forms flat plate part 14d is bonded to the central part (as viewed in the forward-and-backward direction) on the rear surface of flat plate 14A1. Flat plate 14A1 is cut along the one-dot chain lines shown in FIG. 5A and along cutting lines (not illustrated) parallel to these one-dot chain lines, whereby numerous original plates 14A are cut out.

Original plate 14A is bent along the two-dot chain lines shown in FIG. 5B to be formed into the third piezoelectric/electrostrictive device 10c shown in FIG. 5C. The third piezoelectric/electrostrictive device 10c is different in construction from the first piezoelectric/electrostrictive device 10a in that the third piezoelectric/electrostrictive device 10c includes flat plate part 14d; however, the two have the same construction on the other points. Therefore, the third piezoelectric/electrostrictive device 10c has a function similar to that of the first piezoelectric/electrostrictive device 10a, and produces similar actions and effects. However, due to flat plate part 14d, the third piezoelectric/electrostrictive device 10c has a function of reinforcing connecting part 14c and a function of enlarging the bonding area to connecting part 14c.

Figure 6A:
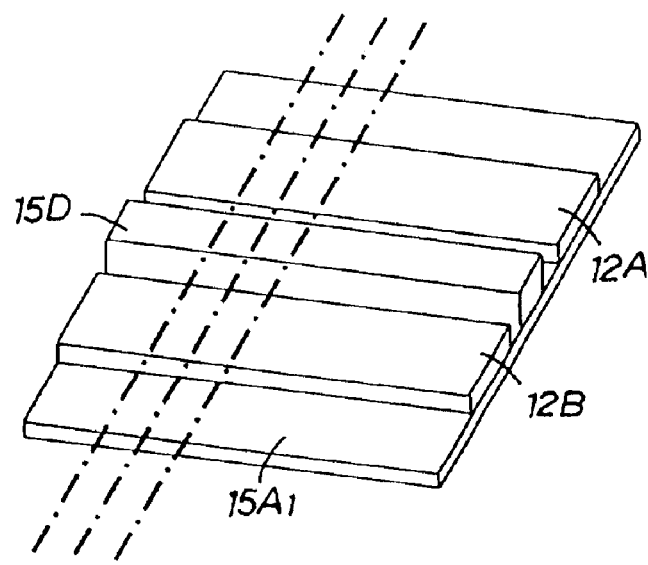
FIG. 6A is a perspective view illustrating a method of preparing the original plate of the base that constitutes the fourth piezoelectric/electrostrictive device.
Figure 6B:
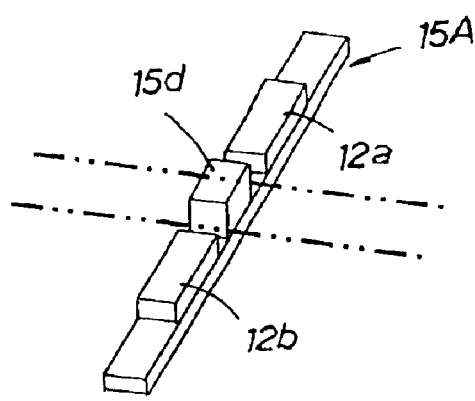
FIG. 6B is a perspective view of the original plate.
Figure 6C:
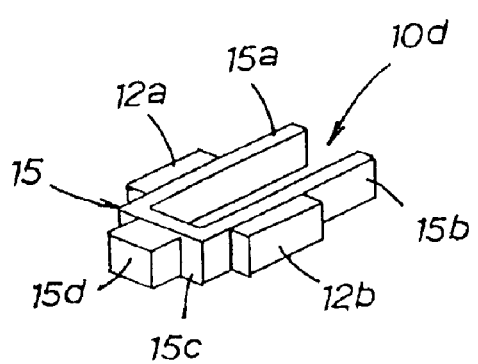
FIG. 6C is a perspective view of the piezoelectric/electrostrictive device composed of the base that is formed from the original plate.

Referring to FIG. 6C, the fourth piezoelectric/electrostrictive device 10d shown in FIG. 1D is made of a base 15 and a pair of piezoelectric/electrostrictive elements 12a, 12b. On this point, the fourth piezoelectric/electrostrictive device 10d is the same as the first piezoelectric/electrostrictive device 10a; however, the fourth piezoelectric/electrostrictive device 10d is different from the first piezoelectric/electrostrictive device 10a in that a flat plate part 15d is disposed on the connecting part 15c constituting the base 15. Flat plate part 15d is placed on the outer surface side of connecting part 15c, that is, on the side opposite to the space between the two movable parts 15a, 15b. Flat plate part 15d functions to enlarge the bonding area to an actuator or the like when connecting part 15c is used as a supporting part for the actuator or the like.

Now, as the original plate for constructing base 15 of the fourth piezoelectric/electrostrictive device 10d, an original plate 15A shown in FIG. 6B is adopted, and original plate 15A is formed by cutting a flat plate 15A1 shown in FIG. 6A along one-dot chain lines. Piezoelectric/electrostrictive element master plates 12A, 12B are bonded to two sites in the middle part (as viewed in the forward-and-backward direction) on the front surface of flat plate 15A1, and a flat-plate-shaped member 15D that forms flat plate part 15d is bonded to the central part (as viewed in the forward-and-backward direction) on the front surface of flat plate 15A1. Flat plate 15A1 is cut along the one-dot chain lines shown in FIG. 6A and along cutting lines (not illustrated) parallel to these one-dot chain lines, whereby numerous original plates 15A are cut out.

Original plate 15A is bent along the two-dot chain lines shown in FIG. 6B to be formed into the fourth piezoelectric/electrostrictive device 10d shown in FIG. 6C. The fourth piezoelectric/electrostrictive device 10d is different in construction from the first piezoelectric/electrostrictive device 10a in that the fourth piezoelectric/electrostrictive device 10d includes flat plate part 15d; however, the two have the same construction on the other points. Therefore, the fourth piezoelectric/electrostrictive device 10d has a function similar to that of the first piezoelectric/electrostrictive device 10a, and produces similar actions and effects. However, due to flat plate part 15d, the fourth piezoelectric/electrostrictive device 10d exhibits a function of enlarging the bonding area to connecting part 15c.

Figure 1F:
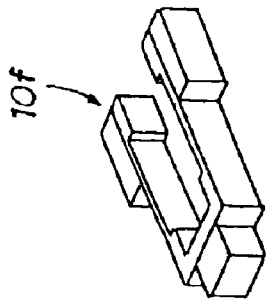
Figure 1E:
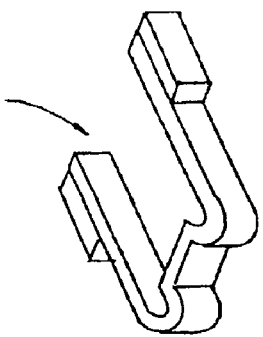

The fifth piezoelectric/electrostrictive devices 10e shown in FIG. 1E is based on the second piezoelectric/electrostrictive device 10b shown in FIG. 1B in construction. Referring to FIG. 7C, the fifth piezoelectric/electrostrictive device 10e shown in FIG. 1E is made of a base 16 and a pair of piezoelectric/electrostrictive elements 12a, 12b. On this point, the fifth piezoelectric/electrostrictive device 10e is the same as the second piezoelectric/electrostrictive device 10b; however, the fifth piezoelectric/electrostrictive device 10e is different from the second piezoelectric/electrostrictive device 10b in that a flat plate part 16d is disposed on the connecting part 16c constituting the base 16. Flat plate part 16d is placed on the outer surface side of connecting part 16c, that is, on the side opposite to the space between the two movable parts 16a, 16b. Flat plate part 16d functions to enlarge the bonding area to an actuator or the like when connecting part 16c is used as a supporting part for the actuator or the like.

Figure 7A:
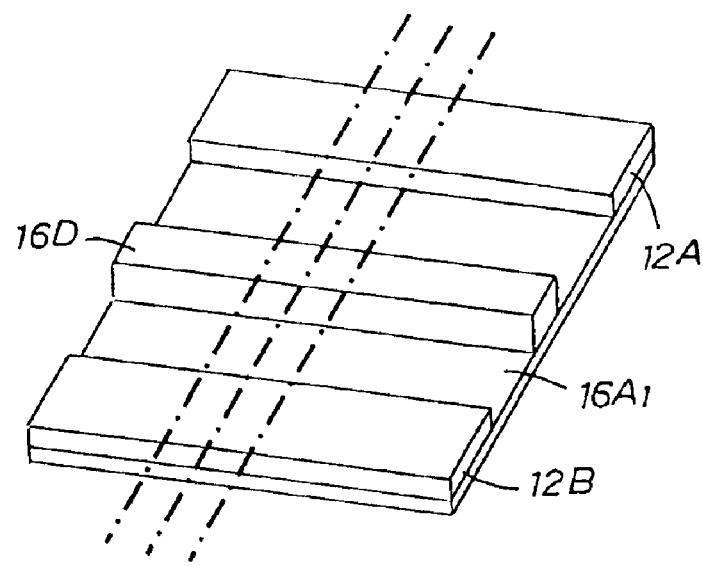
FIG. 7A is a perspective view illustrating a method of preparing the original plate of the base that constitutes the fifth piezoelectric/electrostrictive device.
Figure 7B:
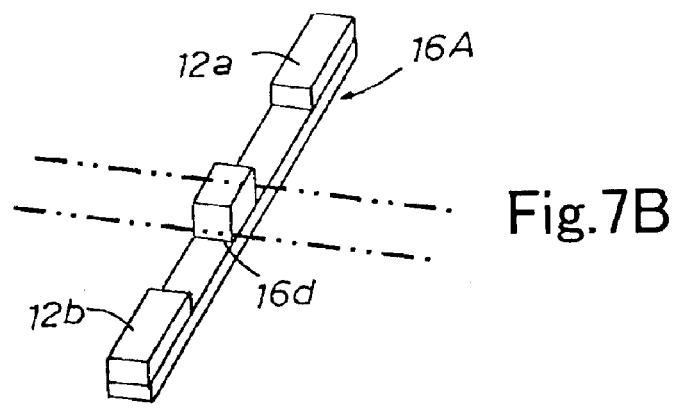
FIG. 7B is a perspective view of the original plate.
Figure 7C:
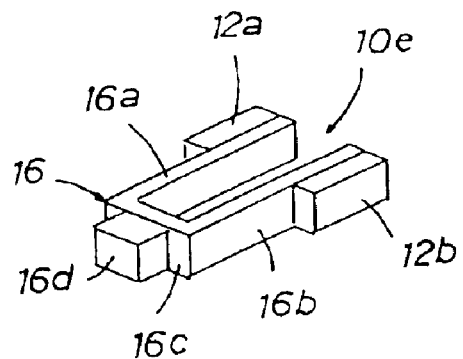
FIG. 7C is a perspective view of the piezoelectric/electrostrictive device composed of the base that is formed from the original plate.

Now, as the original plate for constructing base 16 of the fifth piezoelectric/electrostrictive device 10e, an original plate 16A shown in FIG. 7B is adopted, and original plate 16A is formed by cutting a flat plate 16A1 shown in FIG. 7A along one-dot chain lines. Piezoelectric/electrostrictive element master plates 12A, 12B are bonded to two end sites (as viewed in the forward-and-backward direction) on the front surface of flat plate 16A1, and a flat-plate-shaped member 16D that forms flat plate part 16d is bonded to the central part (as viewed in the forward-and-backward direction) on the front surface of flat plate 16A1. Flat plate 16A1 is cut along the one-dot chain lines shown in FIG. 7A and along cutting lines (not illustrated) parallel to these one-dot chain lines, whereby numerous original plates 16A are cut out.

Original plate 16A is bent along the two-dot chain lines shown in FIG. 7B to be formed into the fifth piezoelectric/electrostrictive device 10e shown in FIG. 7C. The fifth piezoelectric/electrostrictive device 10e is different in construction from the second piezoelectric/electrostrictive device 10b in that the fifth piezoelectric/electrostrictive device 10e includes flat plate part 16d; however, the two have the same construction on the other points. Therefore, the fifth piezoelectric/electrostrictive device 10e has a function similar to that of the second piezoelectric/electrostrictive device 10b, and produces similar actions and effects. However, due to flat plate part 16d, the fifth piezoelectric/electrostrictive device 10e exhibits a function of enlarging the bonding area to connecting part 16c.

Figure 8A:
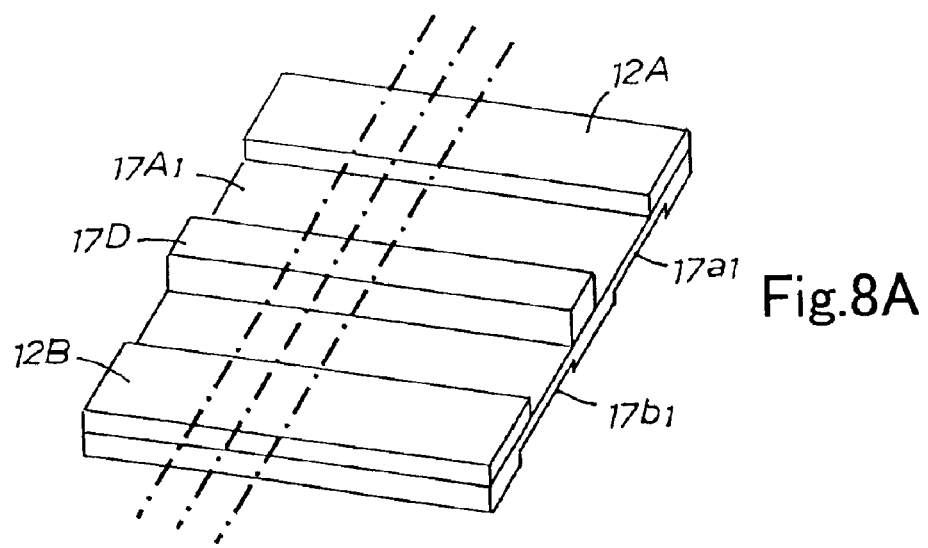
FIG. 8A is a perspective view illustrating a method of preparing the original plate of the base that constitutes the sixth piezoelectric/electrostrictive device.
Figure 8B:
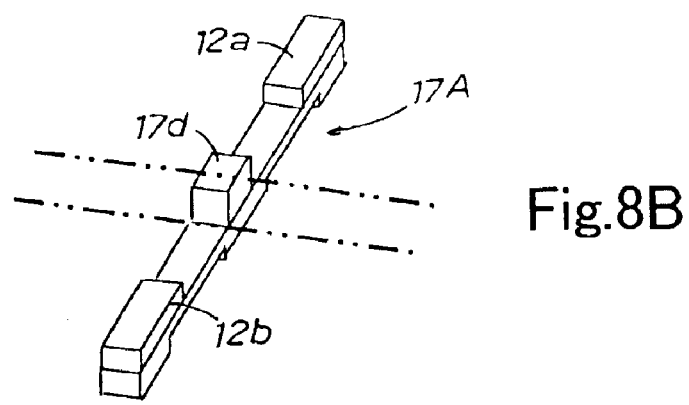
FIG. 8B is a perspective view of the original plate.
Figure 8C:
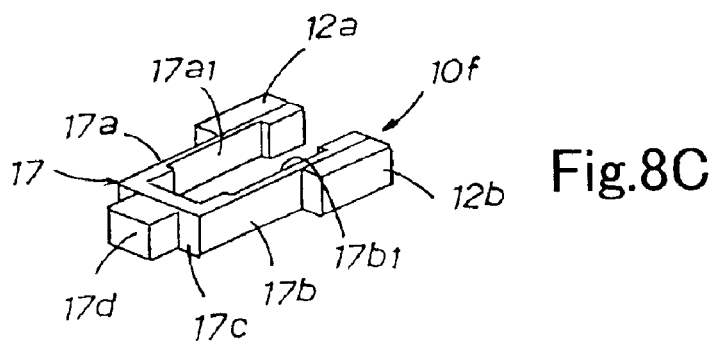
FIG. 8C is a perspective view of the piezoelectric/electrostrictive device composed of the base that is formed from the original plate.

The sixth piezoelectric/electrostrictive device 10f shown in FIG. 1F is based on the second piezoelectric/electrostrictive device 10b shown in FIG. 1B in construction, and has the same construction as the fifth piezoelectric/electrostrictive device 10e in that the sixth piezoelectric/electrostrictive device 10f is made of a base 17 and a pair of piezoelectric/electrostrictive elements 12a, 12b and in that a flat plate part 17d is disposed on the connecting part 17c constituting the base 17, as illustrated in FIG. 8C. However, the sixth piezoelectric/electrostrictive device 10f is different from the fifth piezoelectric/electrostrictive device 10e in that middle parts (as viewed in the longitudinal direction) of the two movable parts 17a, 17b are formed into thinned parts 17a1, 17b1 for a predetermined length. Thinned parts 17a1, 17b1 of the two movable parts 17a, 17b function to increase the amount of displacement of the two movable parts 17a, 17b.

Now, as the original plate for constructing base 17 of the sixth piezoelectric/electrostrictive device 10f, an original plate 17A shown in FIG. 8B is adopted, and original plate 17A is formed by cutting a flat plate 17A1 shown in FIG. 8A along one-dot chain lines. Piezoelectric/electrostrictive element master plates 12A, 12B are bonded to two end sites (as viewed in the forward-and-backward direction) on the front surface of flat plate 17A1, and a flat-plate-shaped member 17D that forms flat plate part 17d is bonded to the central part (as viewed in the forward-and-backward direction) on the front surface of flat plate 17A1.

In flat plate 17A1, two sites in the middle part (as viewed in the forward-and-backward direction) of flat plate 17A1 are formed into thinned parts 17a1, 17b1 for a predetermined length. Flat plate 17A1 is cut along the one-dot chain lines shown in FIG. 8A and along cutting lines (not illustrated) parallel to these one-dot chain lines, whereby numerous original plates 17A are cut out.

Original plate 17A is bent along the two-dot chain lines shown in FIG. 8B to be formed into the sixth piezoelectric/electrostrictive device 10f shown in FIG. 8C. The sixth piezoelectric/electrostrictive device 10f is different in construction from the fifth piezoelectric/electrostrictive device 10e in that movable parts 17a, 17b include thinned parts 17a1, 17b1; however, the two have the same construction on the other points. Therefore, the sixth piezoelectric/electrostrictive device 10f has a function similar to that of the fifth piezoelectric/electrostrictive device 10e, and produces similar actions and effects. However, due to thinned parts 17a1, 17b1, the sixth piezoelectric/electrostrictive device 10f exhibits a function of increasing the amount of displacement of movable parts 17a, 17b.

Here, thinned parts 17a1, 17b1 of flat plate 17A1 and movable parts 17a, 17b in base 17 can be formed by adopting means such as etching, laser machining, electric discharge machining, ion milling, sand blasting, or drill machining. Alternatively, thinned parts 17a1, 17b1 can be formed by preparing extra plates that have been subjected to stamping, and laminating and bonding the plates onto the corresponding sites on a base plate.

The seventh piezoelectric/electrostrictive device 10g and the eighth piezoelectric/electrostrictive device 10h shown in FIGS. 1G and 1H and constituting the seventh and eighth embodiments of the present invention are different in form from the first piezoelectric/electrostrictive device 10a and the second piezoelectric/electrostrictive device 10b constituting the first and second embodiments of the present invention.

Figure 9A:
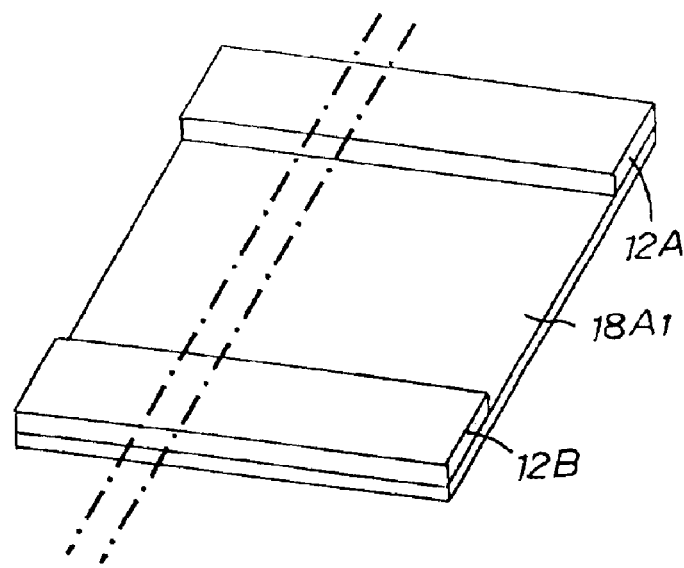
FIG. 9A is a perspective view illustrating a method of preparing the original plate of the base that constitutes the seventh piezoelectric/electrostrictive device.
Figure 9B:
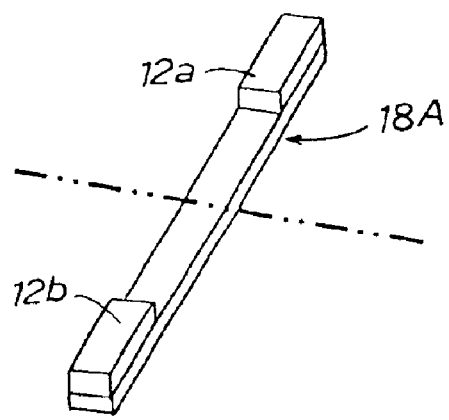
FIG. 9B is a perspective view of the original plate.
Figure 9C:
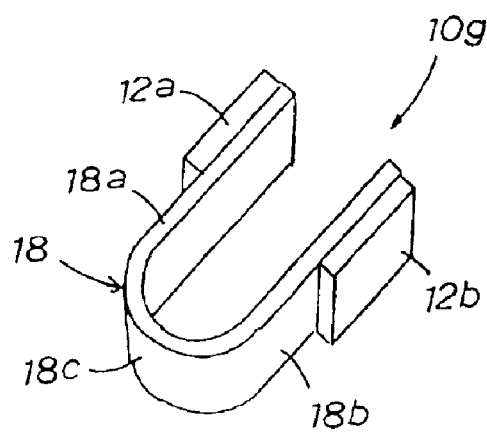
FIG. 9C is a perspective view of the piezoelectric/electrostrictive device composed of the base that is formed from the original plate.

Referring to FIG. 9C, the seventh piezoelectric/electrostrictive device log constituting the seventh embodiment of the present invention is made of a base 18 and a pair of piezoelectric/electrostrictive elements 12a, 12b, and is different from the second piezoelectric/electrostrictive device 10b in that the connecting part 18c constituting the base 18 has a circular arc shape. Connecting part 18c having a circular arc shape functions to achieve an increase in the amount of displacement and a smooth displacement operation of the two movable parts 18a, 18b.

Now, as the original plate for constructing base 18 of the seventh piezoelectric/electrostrictive device 10g, an original plate 18A shown in FIG. 9B is adopted, and original plate 18A is formed by cutting a flat plate 18A1 shown in FIG. 9A along one-dot chain lines. Piezoelectric/electrostrictive element master plates 12A, 12B are bonded to two end sites (as viewed in the forward-and-backward direction) on the front surface of flat plate 18A1. Flat plate 18A1 is cut along the one-dot chain lines shown in FIG. 9A and along cutting lines (not illustrated) parallel to these one-dot chain lines, whereby numerous original plates 18A are cut out.

Original plate 18A is bent along the two-dot chain lines shown in FIG. 9B to be formed into the seventh piezoelectric/electrostrictive device 10g shown in FIG. 9C. The seventh piezoelectric/electrostrictive device 10g is different in construction from the second piezoelectric/electrostrictive device 10b in that the connecting part 18c that connects the two movable parts 18a, 18b exhibits a circular arc shape; however, the two have the same construction on the other points. Therefore, the seventh piezoelectric/electrostrictive device 10g has a function similar to that of the second piezoelectric/electrostrictive device 10b, and produces similar actions and effects. However, due to connecting part 18c having a circular arc shape, the seventh piezoelectric/electrostrictive device 10g functions to achieve an increase in the amount of displacement and a smooth displacement operation of the two movable parts 18a, 18b.

Figure 10A:
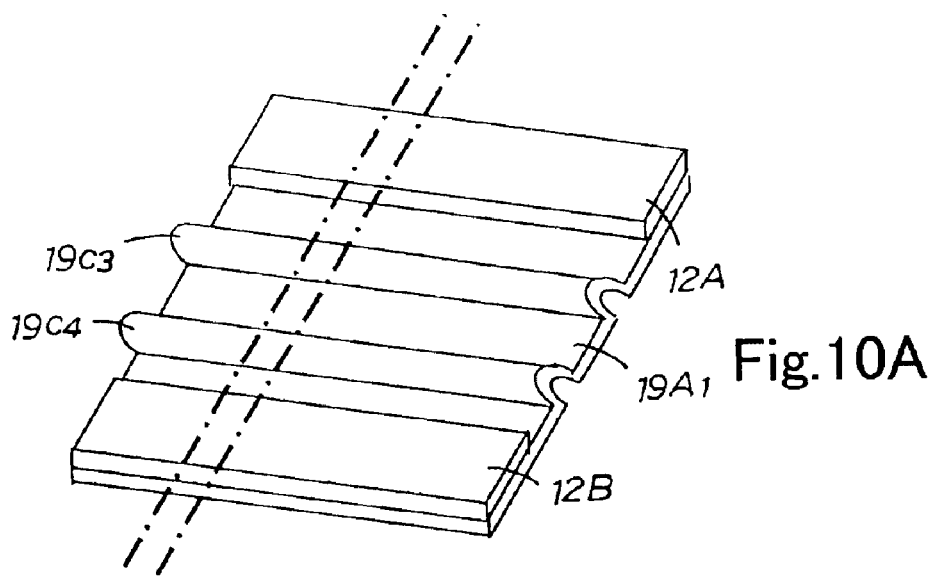
FIG. 10A is a perspective view illustrating a method of preparing the original plate of the base that constitutes the eighth piezoelectric/electrostrictive device.
Figure 10B:
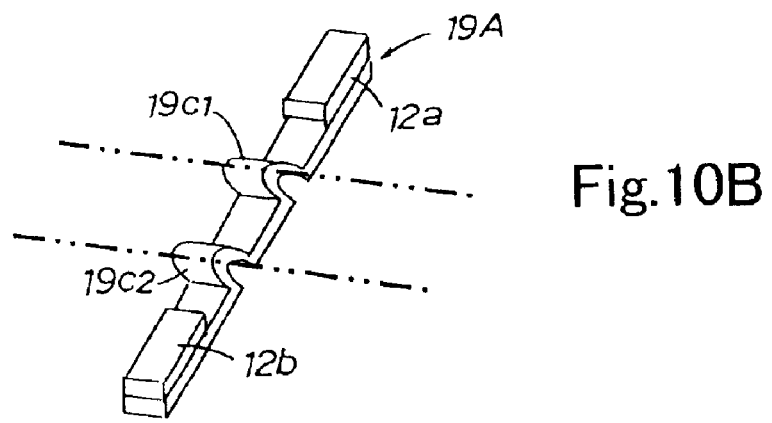
FIG. 10B is a perspective view of the original plate.
Figure 10C:
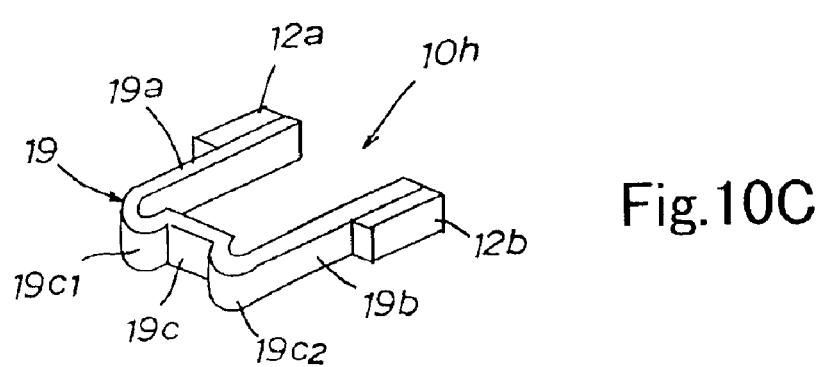
FIG. 10C is a perspective view of the piezoelectric/electrostrictive device composed of the base that is formed from the original plate.

Referring to FIG. 10C, the eighth piezoelectric/electrostrictive device 10h shown in FIG. 1H is made of a base 19 and a pair of piezoelectric/electrostrictive elements 12a, 12b, and is different from the second piezoelectric/electrostrictive device 10b in that the connecting sites 19c1, 19c2 that connect the connecting part 19c to movable parts 19a, 19b constituting the base 19 are formed as recesses having a circular arc shape. The recessed connecting sites 19c1, 19c2 having a circular arc shape function to achieve an increase in the amount of displacement and a smooth displacement operation of the two movable parts 19a, 19b.

Now, as the original plate for constructing base 19 of the eighth piezoelectric/electrostrictive device 10h, an original plate 19A shown in FIG. 10B is adopted, and original plate 19A is formed by cutting a flat plate 19A1 shown in FIG. 10A along one-dot chain lines. Two sites in the middle part (as viewed in the forward-and-backward direction) of flat plate 19A1 are formed to have an undulated shape. These undulated sites 19c3, 19c4 correspond to the connecting sites 19c1, 19c2 so as to form the connecting sites 19c1, 19c2 when original plate 19A is bent. Piezoelectric/electrostrictive element master plates 12A, 12B are bonded to two end sites (as viewed in the forward-and-backward direction) on the front surface of flat plate 19A1. Flat plate 19A1 is cut along the one-dot chain lines shown in FIG. 10A and along cutting lines (not illustrated) parallel to these one-dot chain lines, whereby numerous original plates 19A are cut out.

Original plate 19A is bent along the two-dot chain lines shown in FIG. 10B to be formed into the eighth piezoelectric/electrostrictive device 10h shown in FIG. 10C. The eighth piezoelectric/electrostrictive device 10h is different in construction from the second piezoelectric/electrostrictive device 10b in that the connecting sites 19c1, 19c2 that connect the connecting part 19c to the two movable parts 19a, 19b are formed as recesses having a circular arc shape; however, the two have the same construction on the other points. Therefore, the eighth piezoelectric/electrostrictive device 10h has a function similar to that of the second piezoelectric/electrostrictive device 10b, and produces similar actions and effects. However, due to connecting sites 19c1, 19c2, the eighth piezoelectric/electrostrictive device 10h functions to achieve an increase in the amount of displacement and a smooth displacement operation of the two movable parts 19a, 19b.

In the above-described methods for producing the piezoelectric/electrostrictive devices, as means for cutting flat plates 11A1 to 19A1 to which the piezoelectric/ electrostrictive element master plates are laminated and bonded, one can adopt means such as mechanical machining such as dicing machining or wire saw machining, laser machining using laser such as YAG laser or excimer laser, or electron beam machining.

The piezoelectric/electrostrictive elements 12a, 12b constituting the piezoelectric/electrostrictive devices 10a to 10h according to the above-described embodiments are each provided with a piezoelectric/electrostrictive layer and a pair of electrodes for applying an electric field thereto, and are piezoelectric/electrostrictive elements of unimorph type, bimorph type, or the like. Among these piezoelectric/ electrostrictive elements, piezoelectric/electrostrictive elements of unimorph type are excellent in the stability of the deriving displacement, and are also advantageous for weight reduction, so that they are suitable as a construction component of piezoelectric/electrostrictive devices.

FIGS. 11 and 12 illustrate several examples of piezoelectric/electrostrictive elements 21 to 24 that are suitably adopted as the piezoelectric/electrostrictive elements 12a, 12b constituting the piezoelectric/electrostrictive devices 10a to 10h.

Figure 11A:
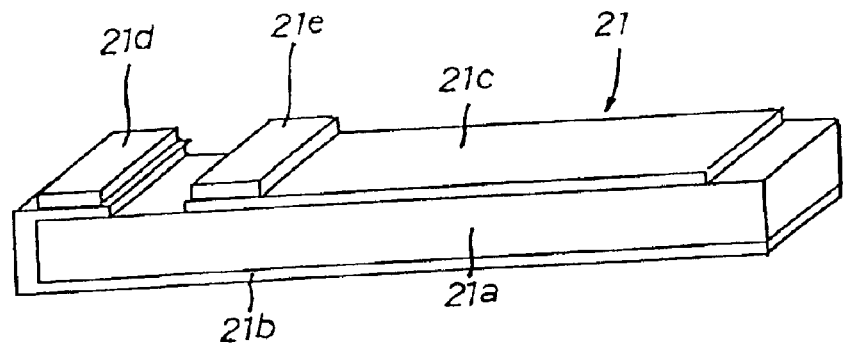
FIGS. 11A and 11B are perspective views illustrating two examples of piezoelectric/electrostrictive elements adopted as the piezoelectric/electrostrictive element constituting the piezoelectric/electrostrictive device according to the present invention.
Figure 11B:
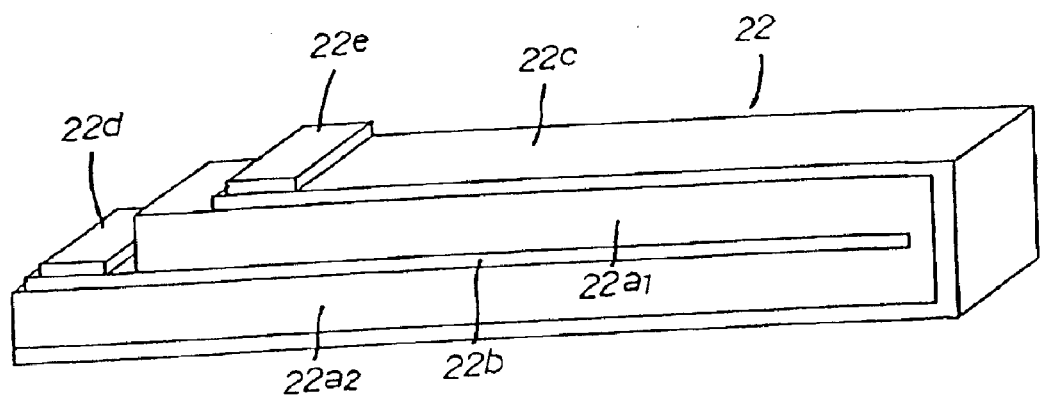

Piezoelectric/electrostrictive element 21 shown in FIG. 11A has a monolayer structure in which the piezoelectric/ electrostrictive layer consists of one layer, and is constructed with a piezoelectric/electrostrictive layer 21a, a pair of first and second electrodes 21b, 21c, and a pair of terminals 21d, 21e. Piezoelectric/electrostrictive element 22 shown in FIG. 11B has a two-layer structure in which the piezoelectric/ electrostrictive layer consists of two layers, and is constructed with piezoelectric/electrostrictive layers 22a (22a1, 22a2), a first electrode 22b that intervenes between the two piezoelectric/electrostrictive layers 22a1, 22a2, a second electrode 22c that surrounds the outer sides of the two piezoelectric/electrostrictive layers 22a1, 22a2, and a pair of terminals 22d, 22e.

Figure 12A:
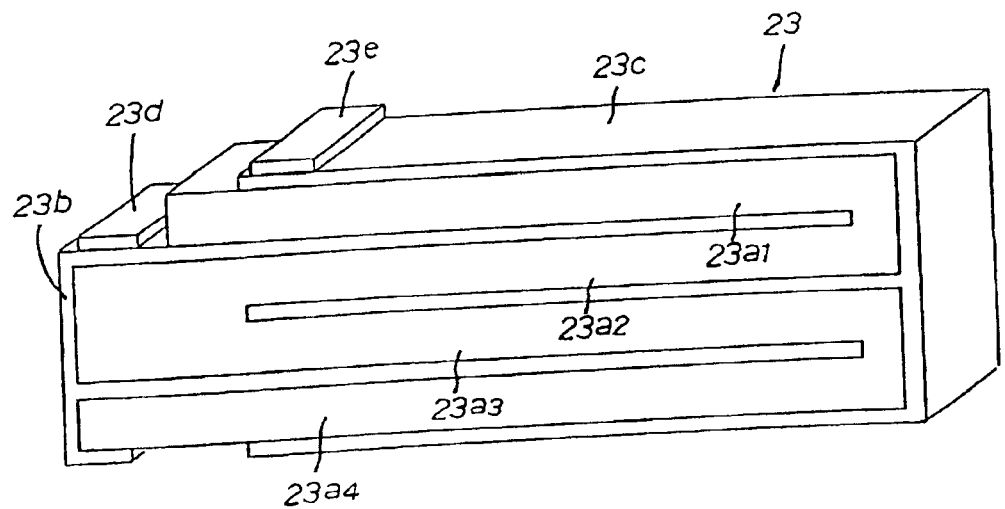
FIG. 12A and FIG. 12B are perspective views illustrating two other examples of piezoelectric/electrostrictive elements adopted as the piezoelectric/electrostrictive element constituting the piezoelectric/electrostrictive device according to the present invention.

Piezoelectric/electrostrictive elements 23, 24 shown in FIG. 12 each have a four-layer structure in which the piezoelectric/electrostrictive layer consists of four layers. Piezoelectric/electrostrictive element 23 shown in FIG. 12A is constructed with piezoelectric/electrostrictive layers 23a (23a1 to 23a4), first and second electrodes 23b, 23c that intervene between and surround these piezoelectric/ electrostrictive layers 23a1 to 23a4, and a pair of terminals 23d, 23e.

Figure 12B:
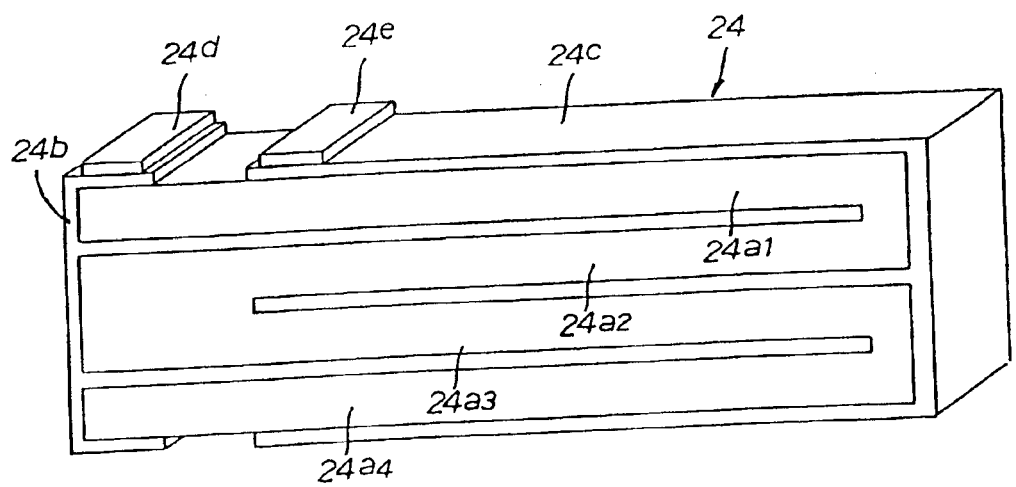

The piezoelectric/electrostrictive element 24 shown in FIG. 12B is different from the piezoelectric/electrostrictive element 23 in that the terminals are placed at different sites. Piezoelectric/electrostrictive element 24 is constructed with piezoelectric/electrostrictive layers 24a (24a1 to 24a2), first and second electrodes 24b, 24c that intervene between and surround the two piezoelectric/electrostrictive layers 24a1 to 24a2, and a pair of terminals 24d, 24e.

These piezoelectric/electrostrictive elements 21 to 24 are suitably adopted as the piezoelectric/electrostrictive elements 12a, 12b of the piezoelectric/electrostrictive devices 10a to 10h in accordance with the intended usage of the piezoelectric/electrostrictive devices.

Though piezoelectric ceramic is used in the piezoelectric/ electrostrictive layers 21a to 24a constituting the piezoelectric/electrostrictive elements 21 to 24, one can use electrostrictive ceramic, ferroelectric ceramic, antiferroelectric ceramic, or the like as well. However, if the piezoelectric/electrostrictive device is to be used as means for positioning the magnetic head of a hard disk drive or the like purpose, it is preferable to use a material whose striction (distortion) hysteresis is small because the linearity between the displacement amount of the mounting part for mounting the magnetic head and the driving voltage or the output voltage is essential. It is preferable to use a material having a coercive electric field of at most 10 kV/mm.

As a material for forming the piezoelectric/electrostrictive layers 21a to 24a, one can specifically mention lead zirconate, lead titanate, magnesium lead niobate, zinc lead niobate, manganese lead niobate, antimony lead stannate, manganese lead tungstate, cobalt lead niobate, barium titanate, bismuth sodium titanate, potassium sodium niobate, strontium bismuth tantalate, and others, which are used either alone or as a suitable mixture thereof. Particularly, a material containing lead zirconate, lead titanate, or magnesium lead niobate as a major component, or a material containing bismuth sodium titanate as a major component is suitable.

The characteristics of the piezoelectric/electrostrictive layers 21a to 24a can be adjusted by adding a suitable material to the materials for forming the piezoelectric/ electrostrictive layers 21a to 24a. As a material to be added, one can mention oxides of lanthanum, calcium, strontium, molybdenum, tungsten, barium, niobium, zinc, nickel, manganese, cesium, cadmium, chromium, cobalt, antimony, iron, yttrium, tantalum, lithium, bismuth, tin, and others, or materials that eventually become these oxides, which are used either alone or as a suitable mixture thereof.

For example, by allowing lanthanum or strontium to be contained in lead zirconate, lead titanate, magnesium lead niobate, or the like constituting the major component, there will be provided an advantage that the coercive electric field or the piezoelectric property can be adjusted. Here, it is preferable to avoid addition of a material that easily undergoes vitrification, such as silica. This is because a material such as silica that easily undergoes vitrification is liable to react with the piezoelectric/electrostrictive layers at the time of thermal treatment of the piezoelectric/electrostrictive layers, and changes their composition to deteriorate the piezoelectric properties.

The electrodes 21b, 21c to 24b, 24c constituting the piezoelectric/electrostrictive elements 21 to 24 are preferably made of a metal material that is solid at room temperature and excellent in electrical conductivity. As a metal material, one can mention metals such as aluminum, titanium, chromium, iron, cobalt, nickel, copper, zinc, niobium, molybdenum, ruthenium, palladium, rhodium, silver, tin, tantalum, tungsten, iridium, platinum, gold, or lead, which are used as a single metal or an alloy of these metals. Further, one can use a cermet material obtained by dispersing ceramics made of the same materials as or made of different materials from the piezoelectric/electrostrictive layers into these metal materials.

Piezoelectric/electrostrictive elements 21 to 24 are preferably formed by integrally sintering the piezoelectric/ electrostrictive layers 21a to 24a and the electrodes 21b, 21c to 24b, 24c in a mutually laminated state. In this case, as the electrodes, it is preferable to adopt those made of a high-melting-point metal material such as platinum, palladium, or an alloy of these, or an electrode made of a cermet material which is a mixture of a high-melting-point metal material and the materials for forming the piezoelectric/ electrostrictive layers or other ceramic materials. The thickness of the electrodes preferably has a film shape as thin as possible because the thickness becomes a factor that affects the displacement of the piezoelectric/electrostrictive elements. For this reason, in order that the electrodes formed by being integrally baked with the piezoelectric/electrostrictive layers have a film shape as thin as possible, it is preferable to use the material for forming the electrodes in a form of a metal paste, for example, a gold resinate paste, platinum resinate paste, silver resinate paste, or the like.

The thickness of each of the piezoelectric/electrostrictive elements 21 to 24 is preferably within a range from 40 $\mu$m to 180 $\mu$m if piezoelectric/electrostrictive elements 21 to 24 are to be used as the piezoelectric/electrostrictive elements 12a, 12b of the piezoelectric/electrostrictive device according to each embodiment. If the thickness is below 40 $\mu$m, piezoelectric/electrostrictive elements 21 to 24 are liable to be broken during the handling, whereas if the thickness exceeds 180 $\mu$m, the scale reduction of the device will be difficult. Further, by allowing the piezoelectric/electrostrictive elements to have a multi-layer structure such as in the piezoelectric/electrostrictive elements 23, 24, one can increase the output of the piezoelectric/electrostrictive elements to enlarge the displacement of the device. Furthermore, by allowing the piezoelectric/electrostrictive elements to have a multi-layer structure, the rigidity of the device will be improved, thereby advantageously raising the resonance frequency of the device to increase the speed of the displacement operation of the device.

Piezoelectric/electrostrictive elements 21 to 24 are prepared using means for cutting an original plate of a large area, which is formed by laminating and sintering the piezoelectric/electrostrictive layers and the electrodes by printing or tape molding, out into a predetermined dimension in a large number with the use of a dicing machine, a slicer, a wire saw, or the like. Piezoelectric/electrostrictive elements 21 to 24 are thinner and have a lower hardness than known ceramic bases, so that the speed of cutting the original plate can be set to be high, whereby the original plates can be processed in a large mass and at a high speed.

Piezoelectric/electrostrictive elements 21 to 24 have a simple plate-shaped structure and can be easily handled with. Also, the amount of adhering dust is small, and the dust can be easily removed. However, since the piezoelectric/electrostrictive elements 21 to 24 are mainly made of a ceramic material, a suitable cleaning condition must be set in supersonic wave cleaning. In a piezoelectric/electrostrictive element cut out from the original plate, it is preferable to perform a precision cleaning treatment by US cleaning and then perform a heat treatment at 100° C. to 1000° C. in atmospheric air so as to completely remove the moisture and organic substances that have penetrated into the fine pores of the ceramic material.

To put the above-described productions of piezoelectric/electrostrictive elements 21 to 24 together, for producing piezoelectric/electrostrictive elements, one can use a thick film forming method such as the screen printing method, the dipping method, the coating method, or the electrophoresis method, or a thin film forming method such as the ion beam method, the sputtering method, the vacuum vapor deposition method, the ion plating method, the chemical vapor deposition method (CVD), or the plating method. In order to form piezoelectric/electrostrictive elements by adopting these production methods, one can form a piezoelectric/electrostrictive element directly on a base or on a flat plate which is an original plate of the base. Alternatively, one may form a piezoelectric/electrostrictive element on a suitable supporting substrate, and then peel the piezoelectric/electrostrictive element off for bonding it onto a base or a flat plate.

If the piezoelectric/electrostrictive elements 21 to 24 are to be adopted as the piezoelectric/electrostrictive elements 12a, 12b constituting the piezoelectric/electrostrictive devices 10a to 10h according to each embodiment, it is preferable to use a resin-series adhesive such as epoxy resin, UV resin, or hot-melt adhesive, or an inorganic adhesive such as glass, cement, solder, or brazing material as a bonding means to the base of each of the piezoelectric/electrostrictive elements 21 to 24. Also, a mixture of resin-series adhesive with metal powder or ceramic powder can be used as well. The hardness of the adhesive is preferably not less than 80 in terms of Shore hardness D.

Further, as another mode for adopting the piezoelectric/electrostrictive elements 21 to 24, one can adopt a mode in which a piezoelectric/electrostrictive element master plate similar to piezoelectric/electrostrictive element master plates 12A, 12B is bonded in advance onto a flat plate constituting the original plate of the base, and this flat plate is cut at a suitable width to cut the piezoelectric/electrostrictive elements out integrally with the original plates of the base, as shown in the methods of producing piezoelectric/electrostrictive devices 10a to 10h. This allows piezoelectric/electrostrictive elements 21 to 24 having a shape shown in FIG. 11 or FIG. 12 to be formed integrally on the original plate of the base.

Here, it is preferable to perform a surface roughening treatment such as blasting, etching, or plating in advance on the surface site of the base where the piezoelectric/electrostrictive element is to be bonded. By allowing the surface roughness of the bonding site to be Ra=about 0.1 $\mu$m to 5 $\mu$m, the bonding area can be increased to improve the adhesive strength. In this case, the surface of the bonding site on the piezoelectric/electrostrictive element side is preferably rough as well. If one wishes that the electrodes are not electrically conducted to the base, the electrodes are not disposed on the surface of the piezoelectric/electrostrictive layer constituting the lowermost layer.

If solder or brazing material is to be used as the adhesive, it is preferable to dispose an electrode layer made of a metal material on the surface of the piezoelectric/electrostrictive element in order to improve the wettability. The thickness of the adhesive is preferably within the range from 1 $\mu$m to 50 $\mu$m. The thickness of the adhesive is preferably small in view of reducing dispersions in the displacement and in the resonance characteristics of the device and in view of saving space; however, in order to ensure the characteristics such as the bonding strength, displacement, and resonance, the optimal thickness is set for each adhesive to be adopted.

The selection in the case of adopting piezoelectric/electrostrictive elements 21 to 24 in piezoelectric/electrostrictive devices 10a to 10h according to each embodiment is carried out on the basis of an intended usage of piezoelectric/electrostrictive devices 10a to 10h. In a piezoelectric/electrostrictive element having a small number of layers constituting the piezoelectric/electrostrictive layer, the driving force is small and the power consumption is small. Conversely, in a piezoelectric/electrostrictive element having a large number of layers constituting the piezoelectric/electrostrictive layer, the driving force is large and the power consumption is large. In consideration of these facts, one selects a piezoelectric/electrostrictive element suitable for the intended usage of the piezoelectric/electrostrictive device. Generally, the piezoelectric/electrostrictive element preferably has a plurality of layers constituting the piezoelectric/electrostrictive layer, and one can suitably adopt a piezoelectric/electrostrictive element having three layers to ten layers constituting the piezoelectric/electrostrictive layer. The shift in the position of the electrodes in the piezoelectric/electrostrictive element is preferably at most 50 $\mu$m.

EXAMPLES

Figure 13:
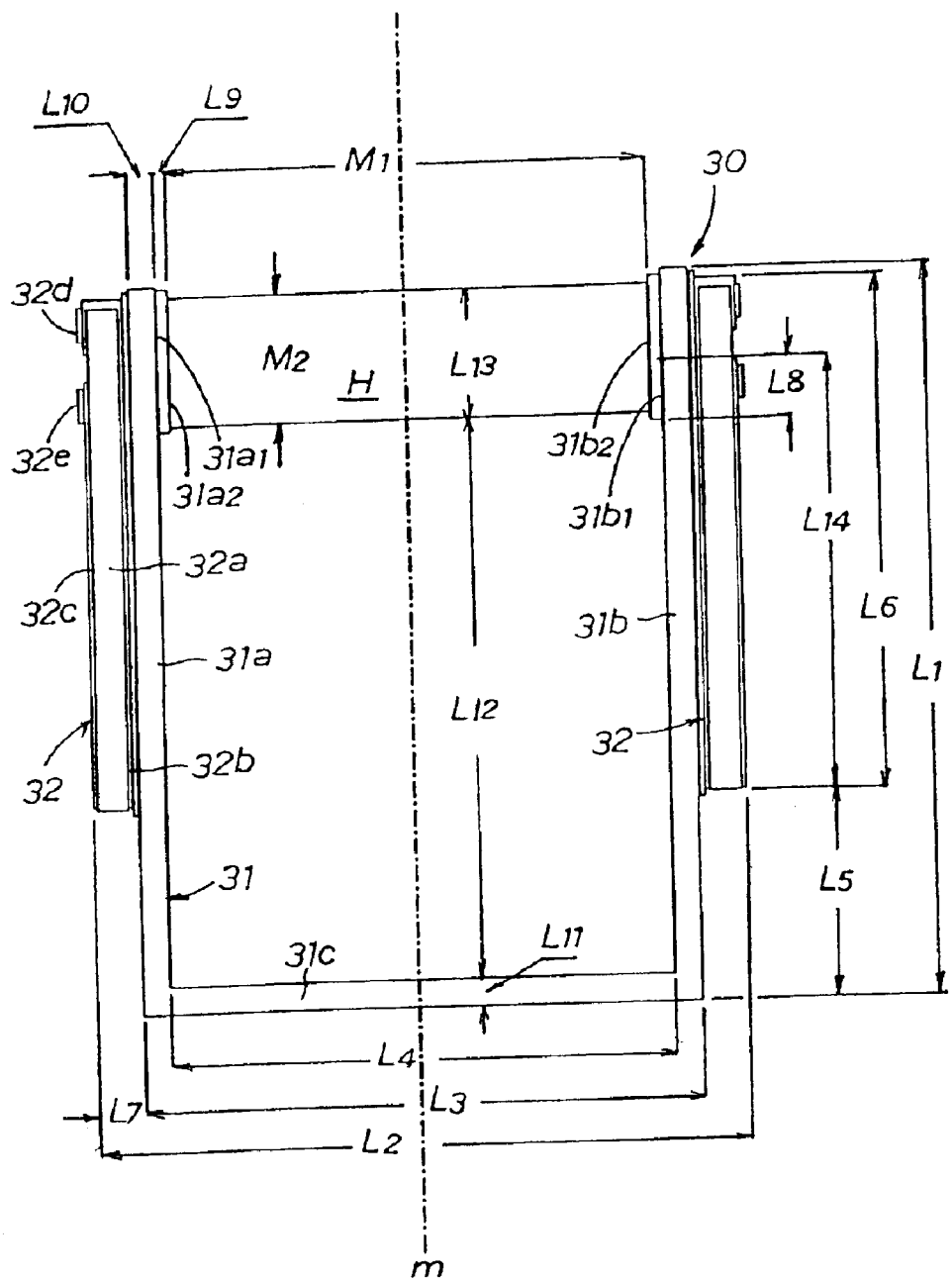
FIG. 13 is a plan view of a piezoelectric/electrostrictive device according to an example of the present invention which is formed by adopting the piezoelectric/electrostrictive element shown in FIG. 12B as the piezoelectric/electrostrictive element.

In this Example, a piezoelectric/electrostrictive device belonging to the category of the second piezoelectric/electrostrictive device 10b shown in FIG. 1B and constituting the second embodiment of the present invention is prepared, and the piezoelectric/electrostrictive device is raised as a representative example of the piezoelectric/electrostrictive device according to the present invention. On the basis of the piezoelectric/electrostrictive device, detailed description will be given on the construction, operation, functions, and effects of the piezoelectric/electrostrictive device according to the present invention. FIG. 13 is a plan view of the piezoelectric/electrostrictive device.

The piezoelectric/electrostrictive device 30 is made of a base 31 and a pair of piezoelectric/electrostrictive elements 32. For each of the piezoelectric/electrostrictive elements 32, a piezoelectric/electrostrictive element 24 shown in FIG. 12B is adopted. Therefore, in the following description of each construction member of the piezoelectric/electrostrictive element 32, the reference symbols of the construction members of the piezoelectric/electrostrictive element 24, which are accompanied by the number 24, will be changed to the corresponding reference symbols accompanied by the number 32 for use.

Base 31 constituting the piezoelectric/electrostrictive device 30 has an open-box shape made of a pair of movable parts 31a, 31b that are arranged in parallel with each other to oppose each other and a connecting part 31c that connects the two movable parts 31a, 31b with each other at one end thereof. The two movable parts 31a, 31b and the connecting part 31c are integrally formed with one sheet of band-shaped flat plate. Base 31 is open to the other end of the two movable parts 31a, 31b, and the inside surfaces at the other end of the two movable parts 31a, 31b are formed to be mounting sites 31a1, 31b1 for mounting a component H such as a magnetic head.

Piezoelectric/electrostrictive elements 32 are bonded onto the outer side surfaces at the other end of movable parts 31a, 31b, and extend for a predetermined length from the other end of movable parts 31a, 31b towards the one end. Further, the two ends of component H are fixed onto the mounting sites 31a1, 31b1 of movable parts 31a, 31b via adhesives 31a2, 31b2.

The dimensions of the sites of base 31 constituting the piezoelectric/electrostrictive device 30 and the sites of piezoelectric/electrostrictive elements 32 are set to be the optimal dimensions in consideration of the supporting strength of the two movable parts 31a, 31b to component H, the amount of displacement imparted to component H by the two movable parts 31a, 31b, and other factors.

In the piezoelectric/electrostrictive device 30, base 31 is formed, for example, with SUS304 having a plate thickness of 40 $\mu$m. Further, as piezoelectric/electrostrictive element 32, piezoelectric/electrostrictive element 24 shown in FIG. 12B is adopted, and is a four-layer structure in which PZT is used. The thickness of each layer of piezoelectric/electrostrictive layers 32a is 15 $\mu$m. Electrodes 32b, 32c are made of platinum of 3 $\mu$m, and terminals 32d, 32e are thin films made of gold paste. Piezoelectric/electrostrictive elements 32 are bonded onto outer sides of movable parts 31a, 31b via a one-liquid thermosetting epoxy resin adhesive.

In the piezoelectric/electrostrictive device 30 having such a construction, the displacement of mounting sites 31a1, 31b1 in movable parts 31a, 31b was measured when piezoelectric/electrostrictive element 32 was driven by a sinusoidal wave of 1 kHz with a driving voltage of 20±20V. The displacement was found to be ±1.5 $\mu$m. Further, the resonance frequency showing the maximum value of displacement was measured by sweeping the frequency at sinusoidal wave voltage ±0.5 V, and was found out to be 45 kHz.

Figure 14:
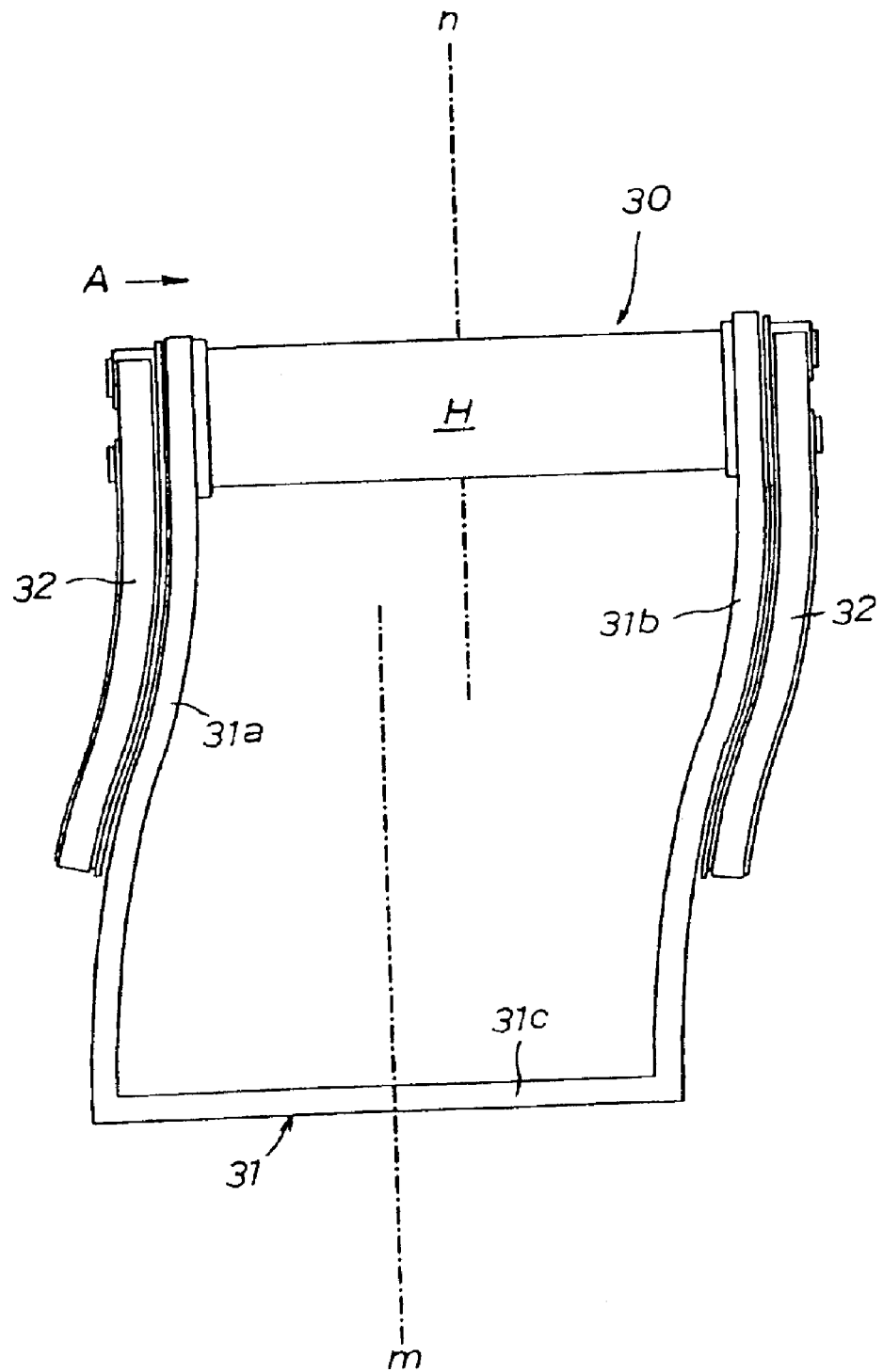
FIG. 14 is a plan view of the piezoelectric/electrostrictive device in an operating state.

Next, the operation of the piezoelectric/electrostrictive device according to the present invention will be described with reference to the above-described piezoelectric/electrostrictive device 30. FIG. 13 shows the piezoelectric/electrostrictive device 30 in a non-operating state, and FIG. 14 shows the piezoelectric/electrostrictive device 30 in an operating state.

The piezoelectric/electrostrictive device 30 is in a state shown in FIG. 13 at the time of non-operation when a voltage is not applied to piezoelectric/electrostrictive elements 32. In this state, the longitudinal axis m of piezoelectric/electrostrictive device 30 is almost coincident with the central axis n between mounting sites 31a1, 31b1. In this state, a sinusoidal wave Wb having a predetermined bias voltage Vb is applied to the pair of electrodes 32b, 32c in one piezoelectric/electrostrictive element 32, for example, as shown in the waveform diagram of FIG. 15A, and a sinusoidal wave Wa having a phase different by approximately 180° from that of the aforesaid sinusoidal wave Wb is applied to the pair of electrodes 32b, 32c in the other piezoelectric/electrostrictive element 32, for example, as shown in FIG. 15B.

This allows that, at the stage when for example the maximum voltage is applied to the pair of electrodes 32b, 32c in the one piezoelectric/electrostrictive element 32, the piezoelectric/electrostrictive layers 32a in the one piezoelectric/electrostrictive element 32 undergo shrinking displacement in the principal surface direction thereof. This generates a stress that warps one movable part 31a of base 31 in the illustrated right direction (direction shown by arrow A) in the piezoelectric/electrostrictive device 30, for example, as shown in FIG. 14. By this stress, movable part 31a is warped in that direction.

In this case, the pair of electrodes 32b, 32c in the other piezoelectric/electrostrictive element 32 are in a state in which a voltage is not applied. Therefore, the other movable part 31b of base 31 follows the warp of the one movable part 31a so as to warp in the same direction as that of movable part 31a. As a result of this, movable parts 31a, 31b both displace in the illustrated right direction with respect to the longitudinal axis m of piezoelectric/electrostrictive device 30. The displacement amount of this displacement changes in accordance with the maximum value of the voltage applied to each of the piezoelectric/electrostrictive elements 32. The larger the maximum value of the voltage is, the larger the displacement amount will be.

Figure 15A:
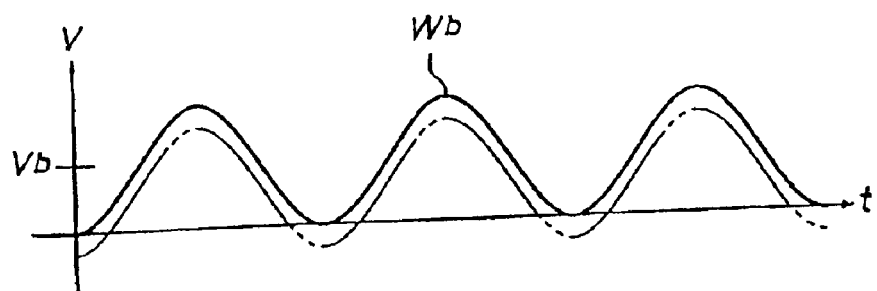
FIGS. 15A and 15B are waveform diagrams respectively showing voltages applied to the two piezoelectric/electrostrictive elements of the piezoelectric/electrostrictive device.
Figure 15B:
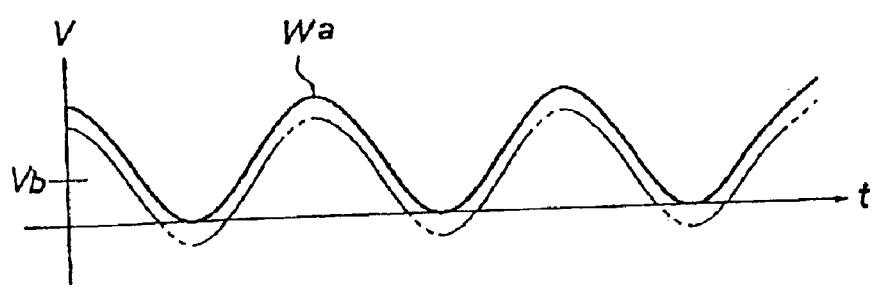

In particular, if a piezoelectric/electrostrictive material having a high coercive electric field is adopted as a material for constructing the piezoelectric/electrostrictive layers 32a constituting the piezoelectric/electrostrictive element 32, the aforesaid bias voltage may be adjusted so that the minimum level will be at a slightly negative level, as illustrated by waveforms drawn in two-dot chain lines in FIGS. 15A and 15B. In this case, by driving the piezoelectric/electrostrictive element to which the bias voltage of negative level is applied, for example, by driving the other piezoelectric/electrostrictive element 32, for example, a stress is generated in the other movable part 31b of base 31 in the same direction as the warping direction of the one movable part 31a, thereby providing a larger displacement amount of mounting sites 31a1, 31b1.

In other words, by using the waveforms shown in two-dot chain lines in FIGS. 15A and 15B, the piezoelectric/electrostrictive element 32 to which the bias voltage of negative level is applied can have a function of supporting the piezoelectric/electrostrictive element 32 acting as a main agent of displacement operation.

Thus, in the piezoelectric/electrostrictive device 30, a minute displacement of piezoelectric/electrostrictive elements 32 is amplified to become a large displacement operation by utilizing the warp of the two movable parts 31a, 31b of base 31, and is transmitted to the two movable parts 31a, 31b. This makes it possible to displace the mounting sites 31a1, 31b1 to a great extent with respect to the longitudinal axis m of piezoelectric/electrostrictive device 30.

In the piezoelectric/electrostrictive device 30, it is preferable to give the following consideration to the dimension relationship of the sites of base 31 and the sites of piezoelectric/electrostrictive elements 32 so that the functions thereof will be exhibited with more certainty.

FIG. 13 shows the dimensions of the sites in the piezoelectric/electrostrictive device 30. In the dimensions, L1 represents the total length of piezoelectric/electrostrictive device 30 and is the total length of base 31, and L2 represents the total width of piezoelectric/electrostrictive device 30. Further, L3 represents the total width of base 31; L4 represents the interval between the two movable parts 31a, 31b of base 31; L5 represents the length of non-bonded sites of piezoelectric/electrostrictive elements 32 in movable parts 31a, 31b; L6 represents the length of piezoelectric/electrostrictive elements 32; and L7 represents the width of piezoelectric/electrostrictive elements 32.

Furthermore, in the dimensions, L8 represents the length of the overlapping portion between the substantial driving part of the piezoelectric/electrostrictive elements and the fixing part of the component mounting part; L9 is the thickness of the adhesive; L10 is the thickness of the movable parts; L11 is the thickness of the connecting part; L12 is the length of the movable sites in the movable parts; L13 is the length of the bonding surface of the mounting parts; L14 is the length of the substantial driving part of piezoelectric/electrostrictive elements 32; M1 is the length of component H; and M2 is the width of component H.

In the piezoelectric/electrostrictive device 30, the relationship between the interval L4 of the two movable parts 31a, 31b of base 31 and the lateral length M1 of component H is such that L4≧M1, and L4−M1=0.001 to 0.01 mm. If L4<M1, it is necessary to enlarge the gap between the two movable parts 31a, 31b in inserting component H between the two movable parts 31a, 31b, and there is a fear of breaking the device in enlarging the gap. The thickness L9 of the adhesive is from 0.005 to 0.1 mm, more preferably from 0.01 to 0.05 mm. If the thickness L9 of the adhesive is larger than 0.1 mm, the adhesive is liable to flow out, making it difficult to insert the adhesive into the thickness of a predetermined dimension.

If the difference between the interval L4 of the two movable parts 31a, 31b of base 31 and the lateral length M1 of component H is small, it is difficult to insert component H into the interval L4 and also it is difficult to inject the adhesive between component H and the mounting sites 31a1, 31b1, making it difficult to control the thickness L9 of the adhesive. If the thickness L9 of the adhesive is set to be smaller than 0.01 mm, dispersions are liable to occur in the bonding strength to component H. For this reason, the thickness L9 of the adhesive is more preferably from 0.01 to 0.03 mm.

The thickness L10 of movable parts 31a, 31b of base 31 is from 0.001 to 0.2 mm, more preferably from 0.01 to 0.1 mm, still more preferably from 0.03 to 0.08 mm. The total width (length) L2 of connecting part 31c, the length L12 of the movable sites of movable parts 31a, 31b, the thickness L9 of the adhesive of mounting sites 31a1, 31b1, the thickness L10 of movable parts 31a, 31b, and others are preferably as small as possible. This reduces the total length L1 and the total width L2 of the device, leading to scale reduction of the device.

The length L12 of the movable sites of movable parts 31a, 31b in base 31 is from 0.2 to 3 mm, preferably from 0.3 to 2 mm. The length L13 of mounting sites 31a2, 31b2 of the two movable parts 31a, 31b is from 0.05 to 2 mm. The interval L4 of the two movable parts 31a, 31b is from 0.1 to 2 mm, preferably from 0.2 to 1.6 mm. With this dimension, the ratio of (length L3 of the two movable parts 31a, 31b)/(interval L4 of the two movable parts 31a, 31b) is from 0.5 to 10, preferably from 0.5 to 5. The ratio of (interval L4 of the two movable parts 31a, 31b)/(thickness L10 of movable parts 31a, 31b) is from 0.5 to 20, preferably from 1 to 15, more preferably from 1 to 10.

The length L8 of the overlapping portion between the substantial driving part of the piezoelectric/electrostrictive elements and the fixing part of the component mounting part is preferably larger than ½ of the thickness L10 of movable parts 31a, 31b, namely, L8>(L10/2). With such setting, the driving force of piezoelectric/electrostrictive layers 32a will act efficiently on the displacement.

In the state shown in FIG. 13, the length L13 of the bonding surface of mounting sites 31a1, 31b1 in movable parts 31a, 31b of the base is set to be approximately equal to the width M2 of component H. However, if the length M1 of component H is larger than the width M2 thereof, in order not to increase the length L13 of mounting sites 31a1, 31b1, one can form mounting sites 31a1, 31b1 to have a bonding-defined length (length defined by bonding or length needed for bonding) as illustrated in device 10f, whereby the length L13 of the bonding surface of mounting sites 31a1, 31b1 is defined independently from the width M2 of component H. Alternatively, one can allow the tip end of component H to protrude from mounting sites 31a1, 31b1 in a state in which component H is bonded.

The length L14 of the substantial driving part of the piezoelectric/electrostrictive elements is preferably from 20 to 95%, more preferably from 40 to 80%, of the length L12 of the movable sites in movable parts 31a, 31b.

The piezoelectric/electrostrictive device 30 can be used, for example, as an actuator for controlling a magnetic head, or as an acceleration sensor.

In the case where the piezoelectric/electrostrictive device 30 is to be used as an actuator for controlling a magnetic head, component H shown in FIG. 13 is a magnetic head, and the piezoelectric/electrostrictive device 30 at connecting part 31c of base 31 thereof is fixed to a suspension. The suspension is a supporting base for supporting the piezoelectric/electrostrictive device 30, and the piezoelectric/electrostrictive device 30 in a state of being fixed to the suspension is in a state in which the sites other than the connecting part 31c thereof are floating above the suspension.

Figure 16:
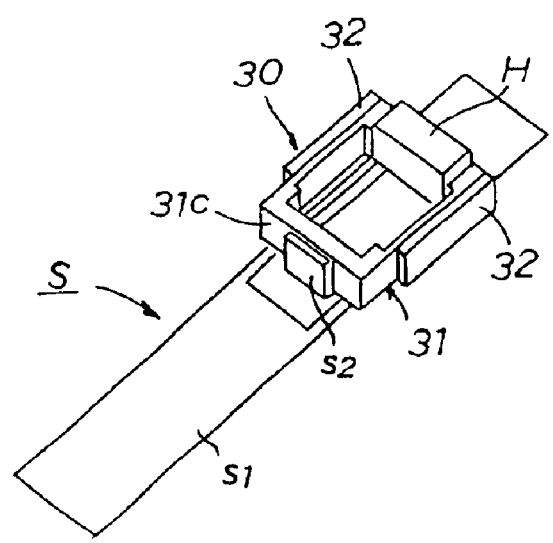
FIG. 16 is a schematic perspective view illustrating an embodiment in which the piezoelectric/electrostrictive device is used as an acceleration sensor.
Figure 17:
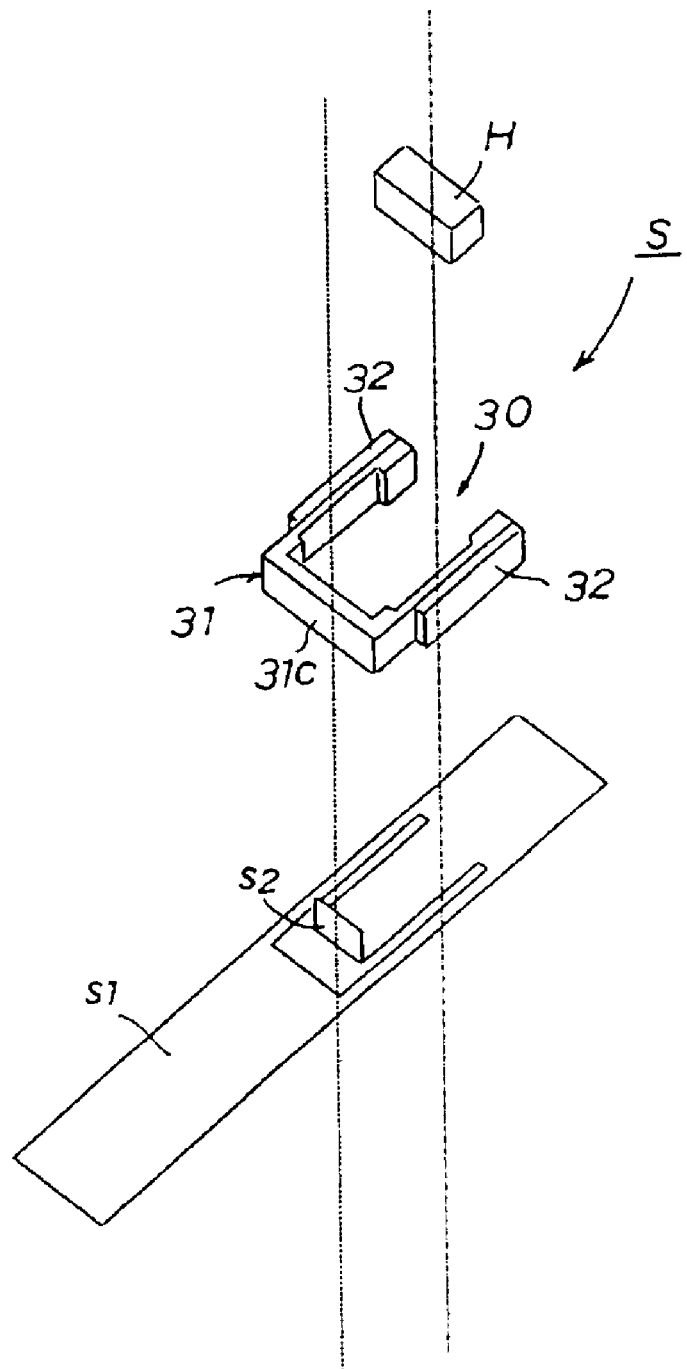
FIG. 17 is a perspective view illustrating the acceleration sensor in a state before assembling.

Further, in the case where the piezoelectric/electrostrictive device 30 is to be used as an acceleration sensor, component H shown in FIG. 13 is a weight, and the weight H is bonded to mounting sites 31a1, 31b1 in the two movable parts 31a, 31b of base 31. FIG. 16 shows a mode in which the piezoelectric/electrostrictive device 30 is used as an acceleration sensor S, and FIG. 17 shows a state before assembling as the acceleration sensor S.

In the acceleration sensor S, weight H is bonded onto mounting sites 31a1, 31b1 of the two movable parts 31a, 31b with the use of an adhesive such as an epoxy resin, and the piezoelectric/electrostrictive device 30 at connecting part 31c thereof is fixed to a mounting site s2 of a wiring substrate s1 via an adhesive such as an epoxy resin. The piezoelectric/electrostrictive device 30 in this mounting state is in a state in which the sites other than the connecting part 31c thereof are floating above the wiring substrate s1. Here, on the wiring substrate s1 are formed wirings for electrical connection and various circuits, illustration of which is omitted.

In the acceleration sensor S, bonding of the piezoelectric/electrostrictive device 30 to wiring substrate s1 can be carried out using spot welding or the like. If spot welding is adopted as bonding means, the bonding area will be small, and the piezoelectric/electrostrictive device 30 can be firmly fixed onto wiring substrate s1. Further, by suitably setting the mass of weight H, the sensitivity in sensing the acceleration can be adjusted.

While the invention has been shown and described in detail, the foregoing description is in all aspects illustrative and not restrictive. It is therefore understood that numerous other modifications and variations can be devised without departing from the scope of the invention.

What is claimed is:

1. A piezoelectric/electrostrictive device comprising a base having a pair of movable parts that are arranged in parallel with each other to oppose each other, a connecting part that connects the two movable parts with each other at one end thereof, and a piezoelectric/electrostrictive element disposed on an outer side surface of at least one of said two movable parts in the base, wherein said base is integrally constructed with one sheet of a band-shaped flat metal plate, and a thickness of said pair of movable parts is substantially the same as a thickness of said base, wherein said movable parts extend for a predetermined length from respective ends of said connecting part to other ends.

2. The piezoelectric/electrostrictive device as claimed in claim 1, wherein said piezoelectric/electrostrictive element is shorter than said movable parts and is positioned at the other end of said movable parts.

3. The piezoelectric/electrostrictive device as claimed in claim 1, wherein said piezoelectric/electrostrictive element is shorter than said movable parts and is positioned at the one end of said movable parts.

4. The piezoelectric/electrostrictive device as claimed in claim 1, wherein said base has a generally open-box shape that is open to the other end of said two movable parts.

5. The piezoelectric/electrostrictive device as claimed in claim 4, wherein said base includes a flat plate part disposed on an inner surface or on an outer surface of said connecting part.

6. The piezoelectric/electrostrictive device as claimed in claim 1, wherein said base has a generally horseshoe shape that is open to the other end of said two movable parts.

7. The piezoelectric/electrostrictive device as claimed in claim 1, wherein connecting sites between the ends of the connecting part and the movable parts constituting said base are formed as recesses having a circular arc shape.

8. The piezoelectric/electrostrictive device as claimed in claim 1, wherein the movable parts of said base include thinned portions located in a middle of a length thereof.

9. The piezoelectric/electrostrictive device as claimed in claim 1, which is used in a mode in which a component to be controlled or tested is sandwiched between inner surfaces of the other ends of said two movable parts constituting said base.

10. A method of producing a base constituting a piezoelectric/electrostrictive device as claimed in claim 1, comprising the steps of:
preparing a flexible and bendable flat plate as a material for forming said base;
cutting the flat plate into flat plates each having a shape that delineates a planar development of said base thereby to form original plates having a narrow strip shape; and
bending each of the original plates at predetermined Sites to form said base integrally having said two movable parts and said connecting part.

11. A method of producing a piezoelectric/electrostrictive device as claimed in claim 1, comprising the steps of:
preparing a flexible and bendable flat plate as a material for forming said base;
cutting the flat plate into flat plates each having a shape that delineates a planar development of said base thereby to form original plates having a narrow strip shape;
bending each of the original plates at predetermined sites so as to form said base integrally having said two movable parts and said connecting part; and
bonding a piezoelectric/electrostrictive element onto an outer side surface of at least one of the two movable parts constituting the base thereby to form the piezoelectric/electrostrictive device.

12. A method of producing a piezoelectric/electrostrictive device as claimed in claim 1, comprising the steps of:
preparing a flexible and bendable flat plate as a material for forming said base, said flat plate having a piezoelectric/electrostrictive element bonded thereto at a predetermined site in advance;
cutting the flat plate integrally with said piezoelectric/electrostrictive element into flat plates each having a shape that delineates a planar development of said base thereby to form original plates having a narrow strip shape; and
bending each of the original plates at predetermined sites to form said base integrally having said two movable parts and said connecting part and to form the piezoelectric/electrostrictive device having the piezoelectric/electrostrictive element bonded onto an outer side surface of at least one of said two movable parts.

* * * * *